US012733541B2

(12) United States Patent
Chang et al.

(10) Patent No.: US 12,733,541 B2
(45) Date of Patent: Sep. 8, 2026

(54) DISPLAY DEVICE AND METHOD FOR MANUFACTURING DISPLAY DEVICE

(71) Applicant: Samsung Display Co., Ltd., Yongin-si (KR)

(72) Inventors: Chongsup Chang, Hwaseong-si (KR); Hyunae Kim, Seoul (KR); Eui Kang Heo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1061 days.

(21) Appl. No.: 17/260,522

(22) PCT Filed: May 13, 2019

(86) PCT No.: PCT/KR2019/005712

§ 371 (c)(1),
(2) Date: Jan. 14, 2021

(87) PCT Pub. No.: WO2020/017746

PCT Pub. Date: Jan. 23, 2020

(65) Prior Publication Data

US 2021/0272938 A1 Sep. 2, 2021

(30) Foreign Application Priority Data

Jul. 18, 2018 (KR) ........................ 10-2018-0083236

(51) Int. Cl.
*H10W 90/00* (2026.01)
*H10D 86/40* (2025.01)
(Continued)

(52) U.S. Cl.
CPC ............ *H10W 90/00* (2026.01); *H10D 86/40* (2025.01); *H10D 86/60* (2025.01); *H10H 20/857* (2025.01); *H10H 20/0364* (2025.01)

(58) Field of Classification Search
CPC . H01L 25/0753; H01L 27/1214; H01L 33/62; H01L 2933/0066; H01L 25/167;
(Continued)

(56) References Cited

U.S. PATENT DOCUMENTS 9,443,904 B1 9/2016 Chen et al.
9,711,750 B1 7/2017 Kim et al.
(Continued)

FOREIGN PATENT DOCUMENTS

CN 105529387 A 4/2016
CN 112041989 A 12/2020
(Continued)

*Primary Examiner* — Jessica S Manno
*Assistant Examiner* — Andrew Chung
(74) *Attorney, Agent, or Firm* — Womble Bond Dickinson (US) LLP

(57) ABSTRACT

A display device includes a first electrode; a second electrode; a light-emitting element; a first pattern portion adjacent to a first area in which the first electrode and the light-emitting element overlap each other in a plan view; a second pattern portion adjacent to a second area in which the second electrode and the light-emitting element overlap each other in a plan view; a first connection electrode covering the light-emitting element and the first pattern portion and being electrically connected to the light-emitting element and the first electrode; and a second connection electrode covering the light-emitting element and the second pattern portion and being electrically connected to the light-emitting element and the second electrode.

20 Claims, 15 Drawing Sheets

(51) Int. Cl.

| | |
|---|---|
| ***H10D 86/60*** | (2025.01) |
| ***H10H 20/857*** | (2025.01) |
| *H10H 20/01* | (2025.01) |

(58) Field of Classification Search

CPC ............ H01L 33/54; H01L 2933/0025; H01L 2933/005; H01L 27/156; H01L 33/005; H01L 33/24; H01L 33/38; H01L 35/56; H10D 86/40; H10D 8/60; H10H 20/857; H10H 20/036; H10H 29/49; H10H 29/857; H10H 20/852–854; H10H 29/852–854

See application file for complete search history.

(56) References Cited

U.S. PATENT DOCUMENTS

| | | | | |
|---|---|---|---|---|
| 9,735,328 | B2 | 8/2017 | Lee et al. | |
| 10,026,777 | B2 | 7/2018 | Kang et al. | |
| 10,340,419 | B2 | 7/2019 | Kim et al. | |
| 10,373,985 | B2 | 8/2019 | Kim et al. | |
| 10,672,946 | B2 | 6/2020 | Cho et al. | |
| 11,367,823 | B2 | 6/2022 | Kim et al. | |
| 2011/0266039 | A1* | 11/2011 | Tomoda | H01L 24/73 156/150 |
| 2012/0199861 | A1 | 8/2012 | Tsuji | |
| 2015/0084054 | A1* | 3/2015 | Fan | H01L 25/0753 257/72 |
| 2016/0163765 | A1* | 6/2016 | Hu | H01L 33/486 438/34 |
| 2017/0256522 | A1* | 9/2017 | Cok | H01L 25/50 |
| 2017/0271312 | A1* | 9/2017 | Kwon | H01L 27/1218 |
| 2017/0358563 | A1* | 12/2017 | Cho | H01L 33/38 |
| 2018/0122788 | A1* | 5/2018 | Wu | H01L 33/385 |
| 2018/0175106 | A1* | 6/2018 | Kim | H01L 33/60 |
| 2018/0211945 | A1* | 7/2018 | Cok | H01L 33/0093 |
| 2019/0165223 | A1* | 5/2019 | Kiridoshi | G09F 9/33 |

FOREIGN PATENT DOCUMENTS

| | | | |
|---|---|---|---|
| EP | 3 787 027 | A1 | 3/2021 |
| KR | 10-2017-0090014 | A | 8/2017 |
| KR | 10-2017-0117282 | A | 10/2017 |
| KR | 10-2018-0007376 | A | 1/2018 |
| KR | 10-2018-0009014 | A | 1/2018 |
| KR | 10-2018-0071465 | A | 6/2018 |

* cited by examiner

DISPLAY DEVICE AND METHOD FOR MANUFACTURING DISPLAY DEVICE

CROSS-REFERENCE TO RELATED APPLICATIONS

This application is a U.S. National Phase Patent Application of International Application No. PCT/KR2019/005712, filed on May 13, 2019, which claims priority to Korean Patent Application No. 10-2018-0083236, filed on Jul. 18, 2018 in the Korean Intellectual Property Office, the entire contents of each of which are incorporated herein by reference.

FIELD

Aspects of embodiments of the present invention relate to a display device, and a method for manufacturing the display device.

BACKGROUND

Display devices may include light-emitting elements. The light-emitting element may be electrically connected to an electrode and may emit light according to a voltage applied to the electrode. The light-emitting element may be formed directly on the electrode. Alternatively, the light-emitting element may be separately formed and then may be disposed on the electrode. When the separately formed light-emitting element is disposed on the electrode, a connection between the light-emitting element and the electrode may not be easy according to a shape of the light-emitting element. In addition, cracks generated in a connection electrode for connecting the light-emitting element and the electrode may cause a phenomenon in which resistance between the light-emitting element and the electrode is increased, which may cause a decrease in luminous efficiency.

SUMMARY

According to an aspect of embodiments of the present invention, a display device having improved reliability, and a method for manufacturing the display device are provided. According to another aspect of embodiments of the present invention, a display device having improved connection stability between a light-emitting element and an electrode, and a method for manufacturing the display device are provided.

A display device according to one or more embodiments of the present invention includes a first electrode; a second electrode spaced apart from the first electrode; a light-emitting element on the first electrode and the second electrode; a first pattern portion adjacent to a first area in which the first electrode and the light-emitting element overlap each other in a plan view; a second pattern portion adjacent to a second area in which the second electrode and the light-emitting element overlap each other in a plan view; a first connection electrode covering the light-emitting element and the first pattern portion and being electrically connected to the light-emitting element and the first electrode; and a second connection electrode covering the light-emitting element and the second pattern portion and being electrically connected to the light-emitting element and the second electrode.

Each of the first pattern portion and the second pattern portion may include an organic material.

The display device may include a plurality of light-emitting elements including the light-emitting element and may be connected in parallel.

A first thickness of the light-emitting element may be greater than a first maximum height of the first pattern portion and a second maximum height of the second pattern portion.

Each of the first maximum height and the second maximum height may be 50% or less of the first thickness.

An inclination angle between the first electrode and the light-emitting element may be 60° or more.

The first connection electrode may include a first portion disposed on the light-emitting element, a second portion disposed on the first pattern portion, and a third portion disposed on the first electrode, and an angle between an inclined surface of the first pattern portion in contact with the second portion and the first electrode disposed under the first pattern portion may be 70° or less.

The display device may further include a protection portion disposed on the light-emitting element, wherein the protection portion is disposed between the first pattern portion and the second pattern portion in a plan view.

The protection portion may include a first protection portion including an inorganic material and a second protection portion including an organic material, and the first protection portion may be disposed between the second protection portion and the light-emitting element.

The display device may further include a first inorganic pattern portion disposed between the first pattern portion and the light-emitting element and between the first pattern portion and the first electrode, and a second inorganic pattern portion disposed between the second pattern portion and the light-emitting element and between the second pattern portion and the second electrode.

The light-emitting element may have a cylindrical shape or a polygonal column shape.

A display device according to one or more embodiments of the present invention includes a first electrode; a second electrode spaced apart from the first electrode; a light-emitting element on the first electrode and the second electrode; a first connection electrode on the first electrode and the light-emitting element and electrically connecting the first electrode and the light-emitting element; a second connection electrode on the second electrode and the light-emitting element and electrically connecting the second electrode and the light-emitting element; a first pattern portion which is between the first connection electrode and the light-emitting element and between the first connection electrode and the first electrode, and includes a first inclined surface in contact with the first connection electrode; and a second pattern portion which is between the second connection electrode and the light-emitting element and between the second connection electrode and the second electrode, and includes a second inclined surface in contact with the second connection electrode.

Each of the first pattern portion and the second pattern portion may include an organic material.

The first pattern portion may surround at least a portion of an area in which the light-emitting element and the first electrode overlap each other in a plan view, and the second pattern portion may surround at least a portion of an area in which the light-emitting element and the second electrode overlap each other in a plan view.

Each of an angle between the first inclined surface and the first electrode and an angle between the second inclined surface and the second electrode may be 70° or less.

A method for manufacturing a display device according to one or more embodiments includes forming a first electrode and a second electrode on an insulating layer; arranging a light-emitting element on the first electrode and the second electrode; forming an organic layer covering the light-emitting element, the first electrode, and the second electrode; arranging a mask on the organic layer; forming an organic pattern by exposing and developing the organic layer using the mask; removing a portion of the organic pattern to form a first pattern portion disposed adjacent to a first area in which the first electrode and the light-emitting element overlap each other in a plan view and form a second pattern portion disposed adjacent to a second area in which the second electrode and the light-emitting element overlap each other in a plan view; and forming a first connection electrode electrically connected to the light-emitting element and the first electrode on the first pattern portion and a second connection electrode electrically connected to the light-emitting element and the second electrode on the second pattern portion.

The mask may be a halftone mask including a half-transparent portion, and the mask may be disposed such that the half-transparent portion is disposed in an area overlapping the first electrode and the second electrode in a plan view.

The method may further include removing a portion of the organic pattern to form a protection portion disposed on the light-emitting element, wherein the protection portion is formed concurrently with the first pattern portion and the second pattern portion.

The method may further include, prior to the forming of the organic layer, forming an inorganic layer covering the light-emitting element, the first electrode, and the second electrode, and after the forming of the first pattern portion and the second pattern portion, removing a portion of the inorganic layer that is exposed to form a first inorganic pattern portion disposed under the first pattern portion and form a second inorganic pattern portion disposed under the second pattern portion.

The method may further include removing a portion of the organic pattern to form an organic protection portion disposed on the light-emitting element, and removing a portion of the inorganic layer to form an inorganic protection portion disposed between the light-emitting element and the organic protection portion, wherein the organic protection portion is formed concurrently with the first pattern portion and the second pattern portion, and the inorganic protection portion is formed concurrently with the first inorganic pattern portion and the second inorganic pattern portion.

According to one or more embodiments of the present invention, a pattern portion is provided between a light-emitting element and a connection electrode connecting the light-emitting element and an electrode. The pattern portion may be provided adjacent to an area in which the light-emitting element and the electrode overlap each other in a plan view. A change in gradient of the connection electrode may be reduced due to the pattern portion. Therefore, it is possible to reduce a phenomenon in which the connection electrode is disconnected or cracked. As a result, the connection stability between the light-emitting element and the electrode may be improved, and the reliability of a display device may be improved. Since the possibility that the connection electrode is disconnected or cracked is reduced, the thickness of the connection electrode may be reduced. Thus, as the thickness of the connection electrode is reduced, a process time of an etching process may be reduced, which may be advantageous for a fine pattern manufacturing process.

DETAILED DESCRIPTION

Figure 1:
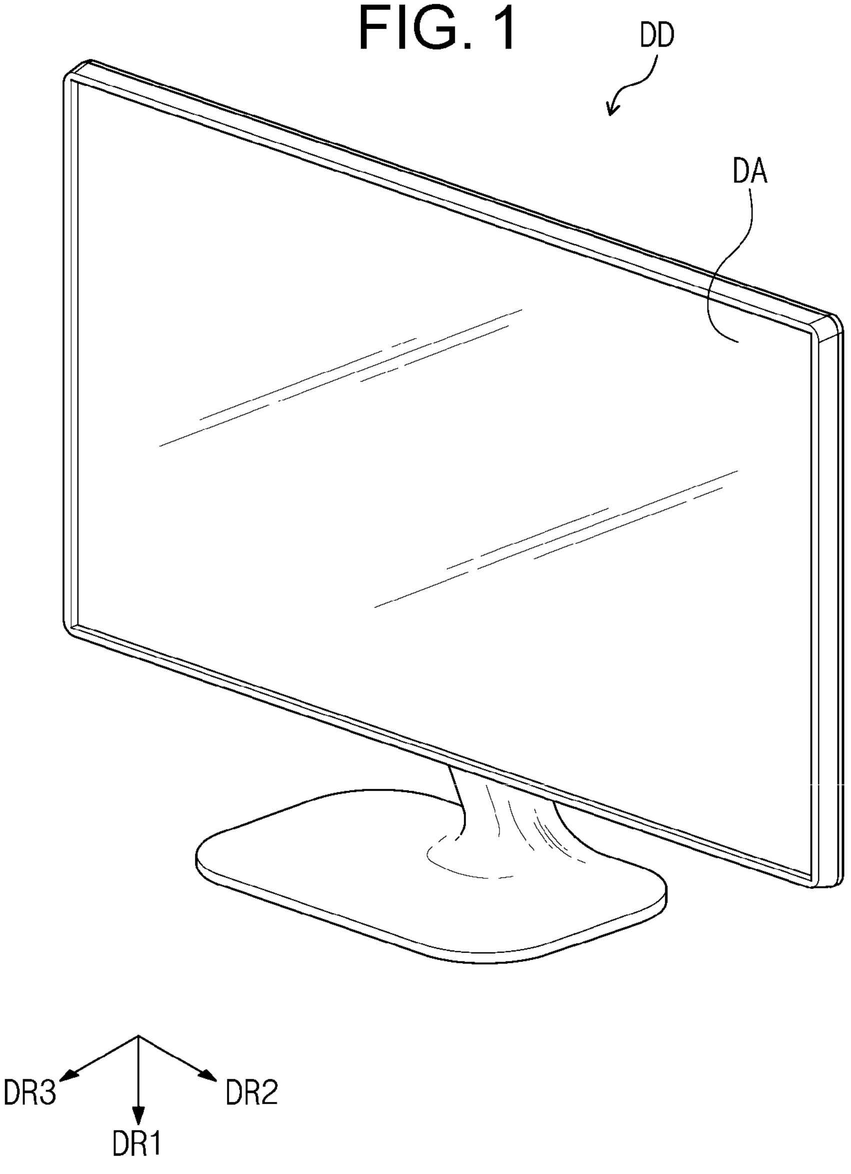
FIG. 1 is a perspective view of a display device according to an embodiment of the present invention.

Some example embodiments will now be described more fully herein with reference to the accompanying drawings; however, the present invention may be embodied in different forms and should not be construed as limited to the embodiments set forth herein.

In this specification, it is to be understood that when one component (or region, layer, portion) is referred to as being "on," "connected to," or "coupled to" another component, it can be directly on/connected to/coupled to the one component, or one or more intervening components may also be present.

Like reference numerals refer to like components throughout. Also, in the drawings, the thickness, ratio, and dimensions of components may be exaggerated for clarity of illustration.

The term "and/or" includes any and all combinations of one or more of the associated listed items.

Although the terms "first," "second," etc. are used herein to describe various components, these components should not be limited by these terms. The terms are used only for the purpose of distinguishing one component from another. For example, without departing from the scope of the present invention, a first component could be termed a second component, and similarly a second component could be also termed a first component. A single form of expression is meant to include multiple components unless otherwise stated.

Also, the terms "under," "below," "above," "upper," and the like may be used herein to explain a relationship between one or more components shown in the drawings. However, the terms may be relative terms describing the positions of components in the drawings and are not to be interpreted as limiting an orientation.

Unless otherwise defined, all terms (including technical and scientific terms) used herein have the same meaning as commonly understood by one of ordinary skill in the art to which the present invention belongs. It is to be further understood that terms, such as those defined in commonly used dictionaries, should be interpreted as having a meaning that is consistent with their meaning in the context of the relevant art and are not to be interpreted in an idealized or overly formal sense unless expressly so defined herein.

It is to be understood that the terms "comprise," "comprising," "include," and/or "including," when used herein, specify the presence of stated features, numbers, steps, operations, elements, and/or components, but do not preclude the presence or addition of one or more other features, numbers, steps, operations, elements, components, and/or groups thereof.

Herein, some example embodiments of the present invention will be described with reference to the accompanying drawings.

FIG. 1 is a perspective view of a display device according to an embodiment of the present invention.

Referring to FIG. 1, a display device DD may display an image through a display area DA. FIG. 1 shows that the display area DA has a surface defined by a first direction DR1 and a second direction DR2 intersecting the first direction DR1. However, in other embodiments of the present invention, the display area DA of the display device DD may have a curved shape.

A thickness direction of the display device DD is indicated by a third direction DR3. The directions indicated by the first to third directions DR1, DR2, and DR3, however, are relative concepts and may be converted to other directions. The term "in a plan view" in the present specification may refer to when viewed in the third direction DR3.

In FIG. 1, the display device DD is shown, as an example, as being a television. However, the display device DD may also be used in small and middle-sized electronic devices such as personal computers, notebook computers, personal digital terminals, vehicle navigation units, game machines, smartphones, tablets, and cameras, as well as monitors or large-sized electronic devices, such as external billboards. In addition, the devices are merely examples, and the display device DD may also be applied to other electronic devices without departing from the spirit and scope of the present invention.

Figure 2:
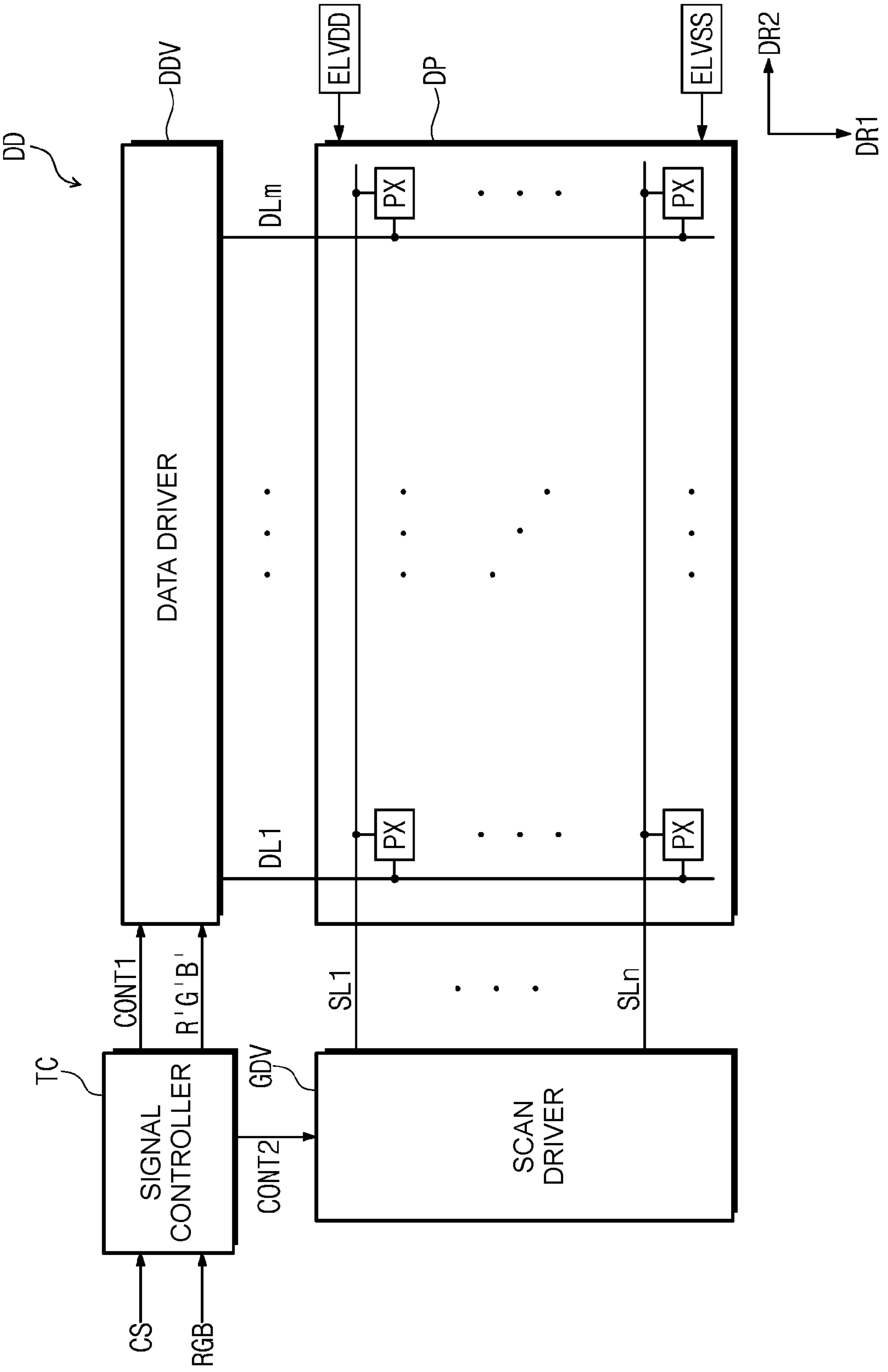
FIG. 2 is a block diagram of the display device according to an embodiment of the present invention.

FIG. 2 is a block diagram of the display device according to an embodiment of the present invention.

Referring to FIG. 2, the display device DD may include a display panel DP, a signal controller (or a timing controller) TC, a data driver DDV, and a scan driver GDV. Each of the signal controller TC, the data driver DDV, and the scan driver GDV may include a circuit.

The display panel DP may be a micro light-emitting element display panel including a micro light-emitting element. For example, the display panel DP may be a micro light-emitting diode (LED) display panel.

The display panel DP may include a plurality of data lines DL1 to DLm, a plurality of scan lines SL1 to SLn, and a plurality of pixels PX.

The plurality of data lines DL1 to DLm may extend in the first direction DR1 and may be arranged in the second direction DR2 intersecting the first direction DR1. The plurality of scan lines SL1-SLn may extend in the second direction DR2 and may be arranged in the first direction DR1.

Each of the pixels PX may include a light-emitting element and a pixel circuit electrically connected to the light-emitting element. The pixel circuit may include a plurality of transistors. A first power voltage ELVDD and a second power voltage ELVSS may be supplied to each of the pixels PX.

The pixels PX may be arranged on a plane surface of the display panel DP according to a certain rule. Each of the pixels PX may display one of primary colors or one of mixed colors. The primary colors may include a red color, a green color, and a blue color, and the mixed colors may include various colors, such as a yellow color, a cyan color, a magenta color, and a white color. However, colors displayed by the pixels PX are not limited thereto.

The signal controller TC receives image data RGB provided from an external source. The signal controller TC generates converted image data R'G'B' by converting the image data RGB so as to be suitable for an operation of the display panel DP and inputs the converted image data R'G'B' to the data driver DDV.

In addition, the signal controller TC may receive control signals CS provided from an external source. The control signals CS may include a vertical synchronization signal, a horizontal synchronization signal, a main clock signal, a data enable signal, and the like. The signal controller TC provides a first control signal CONT1 to the data driver DDV and provides a second control signal CONT2 to the scan driver GDV. The first control signal CONT1 is a signal for controlling the data driver DDV, and the second control signal CONT2 is a signal for controlling the scan driver GDV.

The data driver DDV may drive the plurality of data lines DL1 to DLm in response to the first control signal CONT1 received from the signal controller TC. The data driver DDV may be implemented as an independent integrated circuit and electrically connected to one side of the display panel DP or may be mounted directly on the display panel DP. In addition, the data driver DDV may be implemented as a single chip or may include a plurality of chips.

The scan driver GDV drives the scan lines SL1 to SLn in response to the second control signal CONT2 received from the signal controller TC. The scan driver GDV may be integrated in a certain area of the display panel DP. In this case, the scan driver GDV may include a plurality of thin film transistors formed through a same process as a driving circuit of the pixels PX, for example, a low temperature polycrystalline silicon (LTPS) process or a low temperature polycrystalline oxide (LTPO) process. In an embodiment, the scan driver GDV may be implemented as an independent integrated circuit chip and electrically connected to one side of the display panel DP.

When a gate-on voltage is applied to a scan line of the plurality of scan lines SL1 to SLn, a switching transistor of each of pixels in a row connected to the scan line is turned on. In this case, the data driver DDV provides data driving signals to the data lines DL1 to DLm. The data driving signals provided to the data lines DL1 to DLm are applied to corresponding pixels through the turned-on switching transistors. The data driving signals may be analog voltages corresponding to gradation values of pieces of image data.

Figure 3:
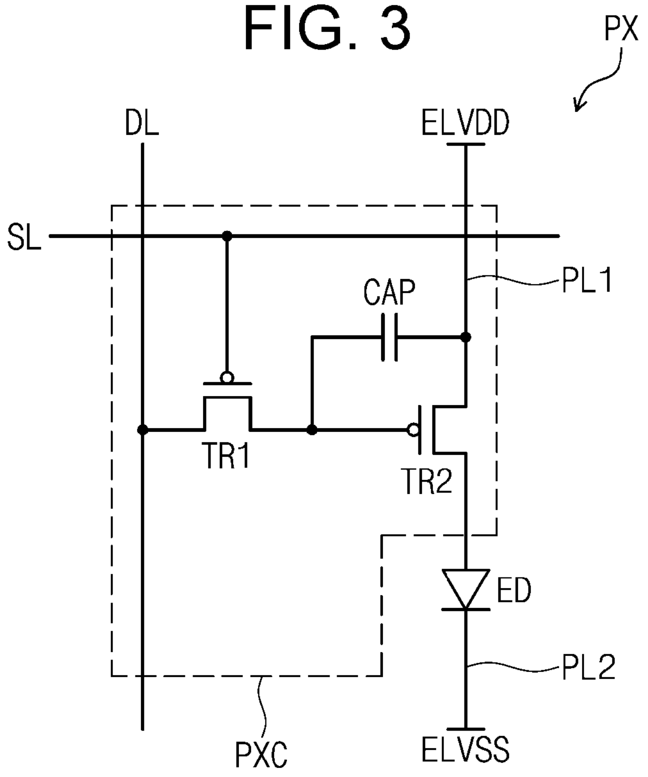
FIG. 3 is an equivalent circuit diagram of a pixel according to an embodiment of the present invention.

FIG. 3 is an equivalent circuit diagram of a pixel according to an embodiment of the present invention.

Referring to FIG. 3, a pixel PX may be connected to a plurality of signal lines. In the present example embodiment, among the signal lines, a scan line SL, a data line DL, a first power line PL1, and a second power line PL2 are shown. However, the signal lines are shown as one example. The pixel PX according to an example embodiment of the present invention may be additionally connected to various signal lines, and the present invention is not limited to any one embodiment.

The pixel PX may include a light-emitting element ED and a pixel circuit PXC. The pixel circuit PXC may include a first thin film transistor TR1, a capacitor CAP, and a second thin film transistor TR2.

The first thin film transistor TR1 may be a switching transistor which controls turn-on or off of the pixel PX. The first thin film transistor TR1 may transmit or block a data signal transferred through the data line DL in response to a gate signal transferred through the scan line SL.

The capacitor CAP is connected to the first thin film transistor TR1 and the first power line PL1. The capacitor CAP is charged with a quantity of electric charge corresponding to a difference between a data signal transferred from the first thin film transistor TR1 and a first power voltage ELVDD applied to the first power line PL1.

The second thin film transistor TR2 is connected to the first thin film transistor TR1, the capacitor CAP, and the light-emitting element ED. The second thin film transistor TR2 controls a driving current flowing in the light-emitting element ED in response to the quantity of electric charge stored in the capacitor CAP. A turn-on time of the second thin film transistor TR2 may be determined according to the quantity of electric charge charged in the capacitor CAP.

In an embodiment, the first thin film transistor TR1 and the second thin film transistor TR2 may be N-type thin film transistors or P-type thin film transistors. Further, in another embodiment of the present invention, one of the first thin film transistor TR1 and the second thin film transistor TR2 may be an N-type thin film transistor and the other thereof may be a P-type thin film transistor.

The light-emitting element ED is connected to the second thin film transistor TR2 and the second power line PL2. The light-emitting element ED emits light at a voltage corresponding to a difference between a signal transferred through the second thin film transistor TR2 and a second power voltage ELVSS received through the second power line PL2.

In an embodiment, the light-emitting element ED may be a micro LED element. The micro LED element may be an LED element having a length in a range of several nanometers to several hundred micrometers. However, the length of the micro LED element is only described as an example, and the length of the micro LED element is not limited to the above numerical range.

Although FIG. 3 shows an example in which one light-emitting element ED is connected between the second thin film transistor TR2 and the second power line PL2, a plurality of light-emitting elements ED may be provided. The plurality of light-emitting elements ED may be connected to each other in parallel.

Figure 4A:
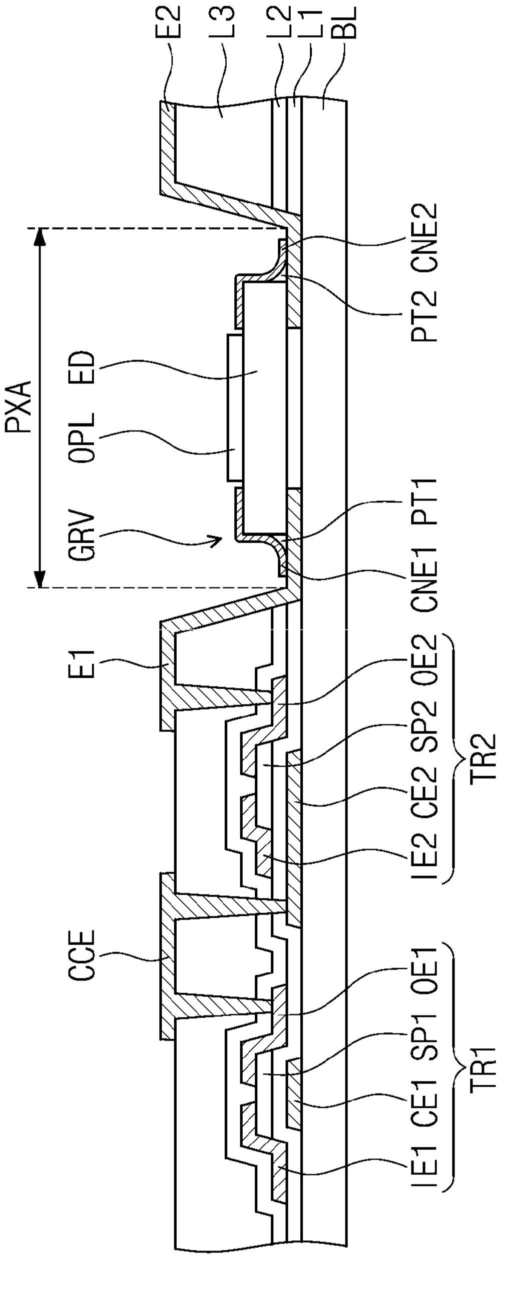
FIG. 4A is a cross-sectional view illustrating a pixel according to an embodiment of the present invention.

FIG. 4A is a cross-sectional view illustrating a pixel according to an embodiment of the present invention. FIG. 4A shows cross-sections of a first thin film transistor TR1, a second thin film transistor TR2, and a light-emitting element ED.

Referring to FIG. 4A, a base layer BL may be a silicon substrate, a plastic substrate, a glass substrate, an insulating film, or a stacked structure including a plurality of insulating layers.

Each of the first thin film transistor TR1 and the second thin film transistor TR2 may be disposed on the base layer BL. The first thin film transistor TR1 may include a first control electrode CE1, a first input electrode IE1, a first output electrode OE1, and a first semiconductor pattern SP1. The second thin film transistor TR2 may include a second control electrode CE2, a second input electrode IE2, a second output electrode OE2, and a second semiconductor pattern SP2.

The first control electrode CE1 and the second control electrode CE2 may be disposed on the base layer BL. The first control electrode CE1 and the second control electrode CE2 may include a conductive material. A first insulating layer L1 may be disposed on the base layer BL and may cover the first control electrode CE1 and the second control electrode CE2. That is, the first control electrode CE1 and the second control electrode CE2 may be disposed between the first insulating layer L1 and the base layer BL.

The first semiconductor pattern SP1 and the second semiconductor pattern SP2 may be disposed on the first insulating layer L1. Each of the first and second semiconductor patterns SP1 and SP2 may include a semiconductor material. For example, the first semiconductor pattern SP1 and the second semiconductor pattern SP2 may include the same semiconductor material, or may include different semiconductor materials. The semiconductor material may include, for example, at least one selected from amorphous silicon, polycrystalline silicon, single crystalline silicon, an oxide semiconductor, and a compound semiconductor. Each of the first and second semiconductor patterns SP1 and SP2 may include a channel region serving as a path through which electrons or holes are moved, and a first ion doping region and a second ion doping region which are disposed with the channel region interposed therebetween.

The first input electrode IE1 and the first output electrode OE1 may be disposed on the first semiconductor pattern SP1, and the second input electrode IE2 and the second output electrode OE2 may be disposed on the second semiconductor pattern SP2.

A second insulating layer L2 may be disposed on the first insulating layer L1 and may cover the first and second semiconductor patterns SP1 and SP2, the first and second input electrodes IE1 and IE2, and the first and second output electrodes OE1 and OE2. That is, the first and second semiconductor patterns SP1 and SP2, the first and second input electrodes IE1 and IE2, and the first and second output electrodes OE1 and OE2 may be disposed between the first insulating layer L1 and the second insulating layer L2.

A third insulating layer L3 may be disposed on the second insulating layer L2. In an embodiment, for example, the first insulating layer L1 and the second insulating layer L2 may include an inorganic material, and the third insulating layer L3 may include an organic material. The third insulating layer L3 may provide a flat surface. The inorganic material may be, for example, silicon nitride, silicon oxynitride, silicon oxide, titanium oxide, or aluminum oxide, but the present invention is not limited thereto.

A connection electrode CCE may be disposed on the third insulating layer L3. The connection electrode CCE may connect the first output electrode OE1 and the second control electrode CE2. A through-hole may be formed in the second and third insulating layers L2 and L3, and the first output electrode OE1 may be exposed by the through-hole. The connection electrode CCE may be electrically connected to the exposed first output electrode OE1. A through-hole may be formed in the first to third insulating layers L1, L2, and L3, and the second control electrode CE2 may be exposed by the through-hole. The connection electrode CCE may be electrically connected to the exposed second control electrode CE2.

A first electrode E1 may be disposed on the third insulating layer L3. A through-hole may be formed in the second and third insulating layers L2 and L3, and the second output electrode OE2 may be exposed by the through-hole. The first electrode E1 may be electrically connected to the exposed second output electrode OE2.

A second electrode E2 may be disposed on the third insulating layer L3. Although not shown, the second electrode E2 may be electrically connected to the second power line PL2 (see FIG. 3). That is, the second power voltage ELVSS (see FIG. 3) may be supplied to the second electrode E2.

In an embodiment, the connection electrode CCE, the first electrode E1, and the second electrode E2 may include a same conductive material. For example, the conductive material may include one selected from indium zinc oxide (IZO), indium tin oxide (ITO), indium gallium oxide (IGO), indium gallium zinc oxide (IGZO), and a mixture/compound thereof. However, the present invention is not limited thereto. For example, the conductive material may be a metal material, and the metal material may include, for example, molybdenum, silver, titanium, copper, aluminum, or an alloy thereof.

In an embodiment of the present invention, each of the first electrode E1 and the second electrode E2 may include a reflective material. Therefore, the first electrode E1 and the second electrode E2 may reflect light emitted from a light-emitting element ED. For example, each of the first electrode E1 and the second electrode E2 may include a reflective electrode and a capping electrode covering the reflective electrode. In an embodiment, the reflective electrode may have a structure in which indium tin oxide (ITO), silver (Ag), and indium tin oxide (ITO) are sequentially stacked, and the capping electrode may include indium zinc oxide (IZO) and may cover the reflective electrode.

A groove GRV may be formed in the first to third insulating layers L1, L2, and L3. The first electrode E1 and the second electrode E2 may extend to be disposed in the groove GRV. The light-emitting element ED may be disposed on the first electrode E1 and the second electrode E2. The light-emitting element ED may be electrically connected to the first electrode E1 and the second electrode E2. A pixel emission area PXA may be defined as an area including an area corresponding to an area in which the light-emitting element ED is disposed.

In another embodiment of the present invention, the groove GRV may be omitted, the first electrode E1 and the second electrode E2 may be disposed on the third insulating layer L3, and the light-emitting element ED may be disposed on the first electrode E1 and the second electrode E2 disposed on the third insulating layer L3.

A first pattern portion PT1 may be disposed in an area adjacent to an area in which the first electrode E1 and the light-emitting element ED overlap each other in a plan view, and a second pattern portion PT2 may be disposed in an area adjacent to an area in which the second electrode E2 and the light-emitting element ED overlap each other in a plan view. The term "in a plan view" may refer to when a display panel DP is viewed in a thickness direction thereof, that is, in the third direction DR3 (see FIG. 1). Further detailed descriptions of the first pattern portion PT1 and the second pattern portion PT2 will be provided below.

A first connection electrode CNE1 may be disposed on the first pattern portion PT1, and the first connection electrode CNE1 may electrically connect the light-emitting element ED and the first electrode E1. A second connection electrode CNE2 may be disposed on the second pattern portion PT2, and the second connection electrode CNE2 may electrically connect the light-emitting element ED and the second electrode E2.

In an embodiment, the first connection electrode CNE1 and the second connection electrode CNE2 may include a same conductive material. For example, the conductive material may include one selected from indium zinc oxide (IZO), indium tin oxide (ITO), indium gallium oxide (IGO), indium gallium zinc oxide (IGZO), and a mixture/compound thereof. However, the present invention is not limited thereto. For example, the conductive material may be a metal material, and the metal material may include, for example, molybdenum, silver, titanium, copper, aluminum, or alloys thereof.

A protection portion OPL may be disposed on the light-emitting element ED. The protection portion OPL may cover at least a portion of the light-emitting element ED to protect the light-emitting element ED. In an embodiment, the protection portion OPL may include a same material as the first pattern portion PT1 and the second pattern portion PT2, and the protection portion OPL, the first pattern portion PT1, and the second pattern portion PT2 may be concurrently (e.g., simultaneously) formed through a same process. In an embodiment, the first pattern portion PT1, the second pattern portion PT2, and the protection portion OPL may include an organic material. In an embodiment, although not shown, a cover layer (not shown), a polarization-functional layer (not shown), a wavelength conversion layer (not shown), or a color filter (not shown) may be disposed on the protection portion OPL.

Figure 4B:
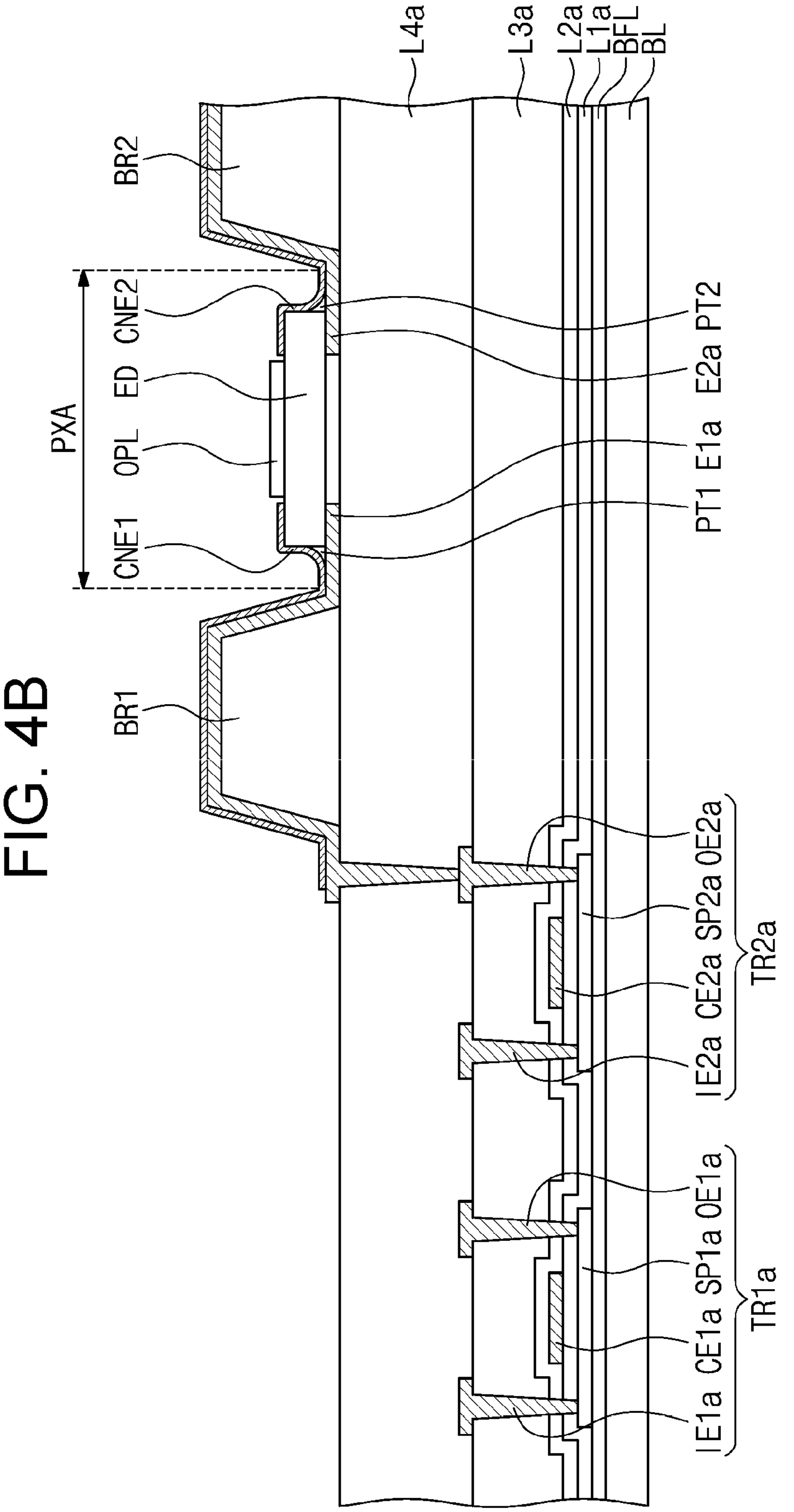
FIG. 4B is a cross-sectional view illustrating a pixel according to an embodiment of the present invention.

FIG. 4B is a cross-sectional view illustrating a pixel according to an embodiment of the present invention.

Referring to FIG. 4B, a buffer layer BFL may be disposed on a base layer BL.

Each of a first thin film transistor TR1*a* and a second thin film transistor TR2*a* may be disposed on the buffer layer BFL.

The first thin film transistor TR1*a* may include a first control electrode CE1*a*, a first input electrode IE1*a*, a first output electrode OE1*a*, and a first semiconductor pattern SP1*a*. The second thin film transistor TR2*a* may include a second control electrode CE2*a*, a second input electrode IE2*a*, a second output electrode OE2*a*, and a second semiconductor pattern SP2*a*.

The first semiconductor pattern SP1*a* and the second semiconductor pattern SP2*a* may be disposed on the buffer layer BFL. The buffer layer BFL may provide modified surfaces to the first semiconductor pattern SP1*a* and the second semiconductor pattern SP2*a*. In an embodiment, the first semiconductor pattern SP1*a* and the second semiconductor pattern SP2*a* may have higher adhesion with respect to the buffer layer BFL as compared with a case in which the first semiconductor pattern SP1*a* and the second semiconductor pattern SP2*a* are formed directly on the base layer BL. In an embodiment, the buffer layer BFL may be a barrier layer which protects a lower surface of each of the first semiconductor pattern SP1*a* and the second semiconductor pattern SP2*a*. In this case, the buffer layer BFL may block contamination or moisture introduced into the base layer BL itself or through the base layer BL from permeating into the first semiconductor pattern SP1*a* and the second semiconductor pattern SP2*a*.

A first insulating layer L1*a* may be disposed on the buffer layer BFL and may cover the first semiconductor pattern SP1*a* and the second semiconductor pattern SP2*a*. In an embodiment, the first insulating layer L1*a* may include an inorganic material.

The first control electrode CE1*a* and the second control electrode CE2*a* may be disposed on the first insulating layer L1*a*. A second insulating layer L2*a* may be disposed on the first insulating layer L1*a* and may cover the first control electrode CE1*a* and the second control electrode CE2*a*. In an embodiment, the second insulating layer L2*a* may include an inorganic material. At least some of signal lines, for example, scan lines or data lines, may be disposed on the second insulating layer L2*a*.

A third insulating layer L3*a* may be disposed on the second insulating layer L2*a* and may cover at least some of the signal lines.

The first input electrode IE1*a*, the first output electrode OE1*a*, the second input electrode IE2*a*, and the second output electrode OE2*a* may be disposed on the third insulating layer L3*a*. The first input electrode IE1*a* and the first output electrode OE1*a* may be connected to the first semiconductor pattern SP1*a* through through-holes passing through the first to third insulating layers L1*a*, L2*a*, and L3*a*. The second input electrode IE2*a* and the second output electrode OE2*a* may be connected to the second semiconductor pattern SP2*a* through through-holes passing through the first to third insulating layers L1*a*, L2*a*, and L3*a*.

A fourth insulating layer L4*a* may be disposed on the third insulating layer L3*a* and may cover the first input electrode IE1*a*, the first output electrode OE1*a*, the second input electrode IE2*a*, and the second output electrode OE2*a*. The fourth insulating layer L4*a* may be provided as a single layer or a plurality of layers, and the fourth insulating layer L4*a* may include an organic material and/or an inorganic material.

A first partition wall BR1 and a second partition wall BR2 may be disposed on the fourth insulating layer L4*a*. The first partition wall BR1 and the second partition wall BR2 may be disposed to be spaced apart from each other.

A first electrode E1*a* may cover the first partition wall BR1 and may be disposed on the fourth insulating layer L4*a*. A through-hole may be formed in the fourth insulating layer L4*a*, and the second output electrode OE2*a* may be exposed by the through-hole. The first electrode E1*a* may be electrically connected to the exposed second output electrode OE2*a*.

A second electrode E2*a* may cover the second partition wall BR2 and may be disposed on the fourth insulating layer L4*a*. Although not shown, the second electrode E2*a* may be electrically connected to the second power line PL2 (see FIG. 3). That is, the second power voltage ELVSS (see FIG. 3) may be supplied to the second electrode E2*a*.

A light-emitting element ED may be disposed on the first electrode E1*a* and the second electrode E2*a*. The light-emitting element ED may be electrically connected to the first electrode E1*a* and the second electrode E2*a*.

FIG. 4B shows an example in which the light-emitting element ED is disposed on the fourth insulating layer L4*a*, but the present invention is not limited thereto. In another embodiment of the present invention, a groove (not shown) may be provided in the first to fourth insulating layers L1*a*, L2*a*, L3*a*, and L4*a*. The shape of the groove may be similar to that of the groove GRV shown in FIG. 4A. The first electrode E1*a* and the second electrode E2*a* may extend to be disposed on the buffer layer BFL exposed by the groove, and the light-emitting element ED may be disposed on the extending first and second electrodes E1*a* and E2*a*.

Figure 5A:
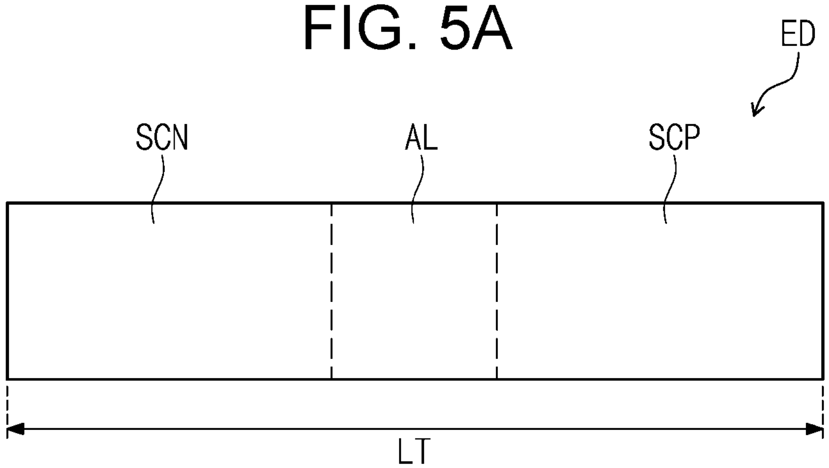
FIG. 5A is a cross-sectional view of a light-emitting element according to an embodiment of the present invention.

FIG. 5A is a cross-sectional view of a light-emitting element according to an embodiment of the present invention.

Referring to FIG. 5A, a light-emitting element ED may have any of various shapes, such as a cylindrical shape and a polygonal column shape.

The light-emitting element ED may include an N-type semiconductor layer SCN, a P-type semiconductor layer SCP, and an active layer AL. The active layer AL may be disposed between the N-type semiconductor layer SCN and the P-type semiconductor layer SCP.

The N-type semiconductor layer SCN may be provided by an N-type dopant being doped into a semiconductor layer, and the P-type semiconductor layer SCP may be provided by a P-type dopant being doped into a semiconductor layer. The semiconductor layer may include a semiconductor material, and the semiconductor material may be, for example, GaN, AlN, AlGaN, InGaN, InN, InAlGaN, or AlInN, but is not limited thereto. The N-type dopant may be silicon (Si), germanium (Ge), tin (Sn), selenium (Se), tellurium (Te), or a combination thereof, but is not limited thereto. The P-type dopant may be magnesium (Mg), zinc (Zn), calcium (Ca), strontium (Sr), barium (Ba), or a combination thereof, but is not limited thereto.

The active layer AL may be formed to have at least one of a single-quantum well structure, a multi-quantum well structure, a quantum wire structure, and a quantum dot structure. The active layer AL may be a region in which electrons injected through the N-type semiconductor layer SCN and holes injected through the P-type semiconductor layer SCP recombine. The active layer AL is a layer which emits light having energy determined by an intrinsic energy band of a material. The position of the active layer AL may be variously changed according to a type of diode.

In an embodiment, a length LT of the light-emitting element ED may be in a range of several nanometers to several hundred micrometers. For example, the length LT of the light-emitting element ED may be in a range of 1 micrometer to 100 micrometers.

Figure 5B:
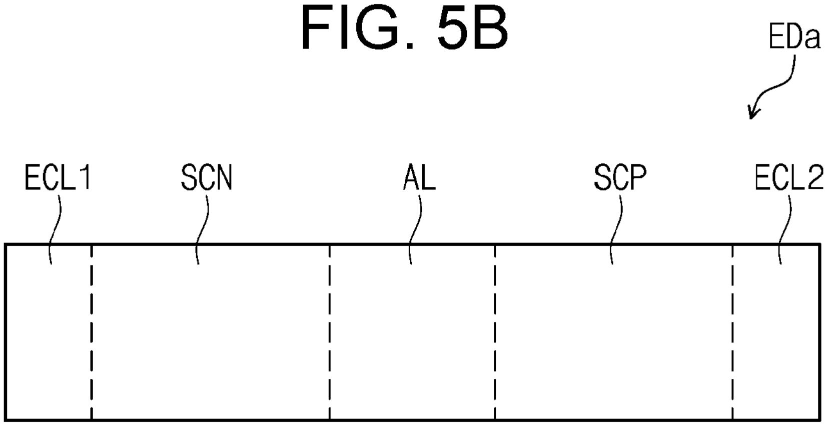
FIG. 5B is a cross-sectional view of a light-emitting element according to an embodiment of the present invention.

FIG. 5B is a cross-sectional view of a light-emitting element according to an embodiment of the present invention.

Referring to FIG. 5B, in comparison to the light-emitting element ED of FIG. 5A, a light-emitting element EDa may further include a first electrode layer ECL1 and a second electrode layer ECL2.

The first electrode layer ECL1 may be adjacent to an N-type semiconductor layer SCN, and the second electrode layer ECL2 may be adjacent to a P-type semiconductor layer SCP. For example, the first electrode layer ECL1, the N-type semiconductor layer SCN, an active layer AL, the P-type semiconductor layer SCP, and the second electrode layer ECL2 may be sequentially stacked.

Each of the first electrode layer ECL1 and the second electrode layer ECL2 may be made of a metal or an alloy of metals. For example, each of the first electrode layer ECL1 and the second electrode layer ECL2 may be made of at least one metal selected from molybdenum (Mo), chromium (Cr), nickel (Ni), gold (Au), aluminum (Al), titanium (Ti), platinum (Pt), vanadium (V), tungsten (W), lead (Pb), copper (Cu), rhodium (Rh), and iridium (Ir) or may be made of an alloy of the metals. The first electrode layer ECL1 and the second electrode layer ECL2 may include a same material or may include different materials.

Figure 5C:
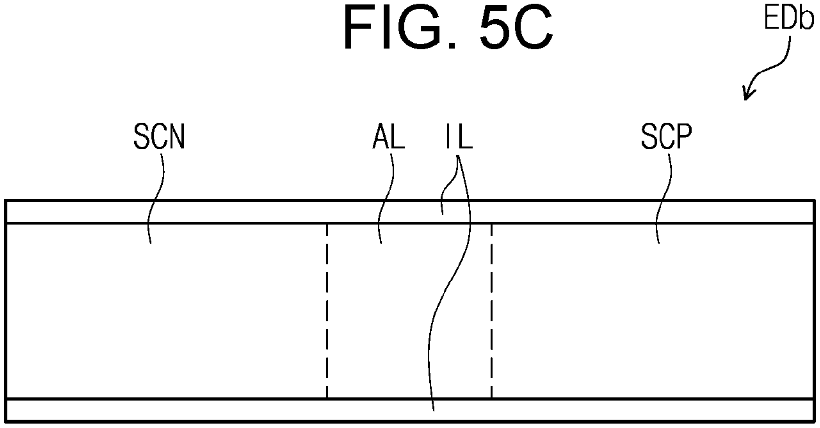
FIG. 5C is a cross-sectional view of a light-emitting element according to an embodiment of the present invention.

FIG. 5C is a cross-sectional view of a light-emitting element according to an embodiment of the present invention.

Referring to FIG. 5C, in comparison to the light-emitting element ED of FIG. 5A, a light-emitting element EDb may further include an insulating film IL. For example, the light-emitting element EDb may have a core-shell structure.

The insulating film IL may cover an N-type semiconductor layer SCN, a P-type semiconductor layer SCP, and an active layer AL to protect outer surfaces of the N-type semiconductor layer SCN, the P-type semiconductor layer SCP, and the active layer AL. In another embodiment of the present invention, the insulating film IL may cover only the active layer AL.

Figure 5D:
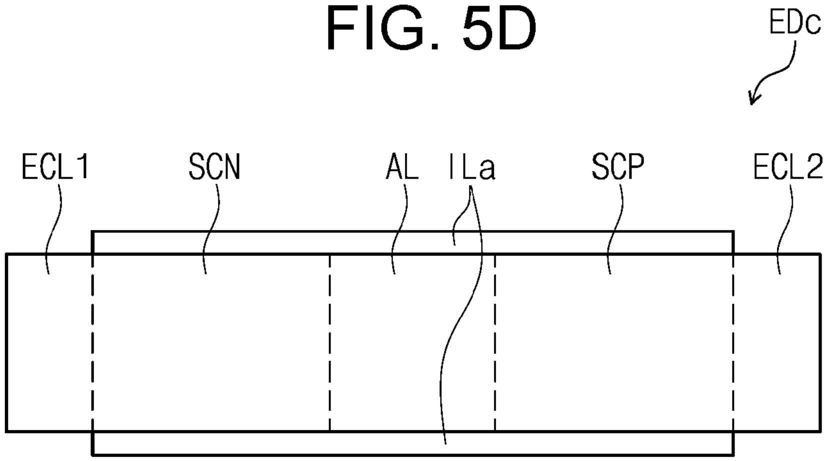
FIG. 5D is a cross-sectional view of a light-emitting element according to an embodiment of the present invention.

FIG. 5D is a cross-sectional view of a light-emitting element according to an embodiment of the present invention.

Referring to FIG. 5D, in comparison to the light-emitting element EDa of FIG. 5B, a light-emitting element EDc may further include an insulating film ILa.

The insulating film ILa may cover an N-type semiconductor layer SCN, a P-type semiconductor layer SCP, and an active layer AL and may not cover a first electrode layer ECL1 and a second electrode layer ECL2. However, in another embodiment of the present invention, the insulating film ILa may cover at least some of the first electrode layer ECL1 and the second electrode layer ECL2 or may cover both the first electrode layer ECL1 and the second electrode layer ECL2.

Figure 6:
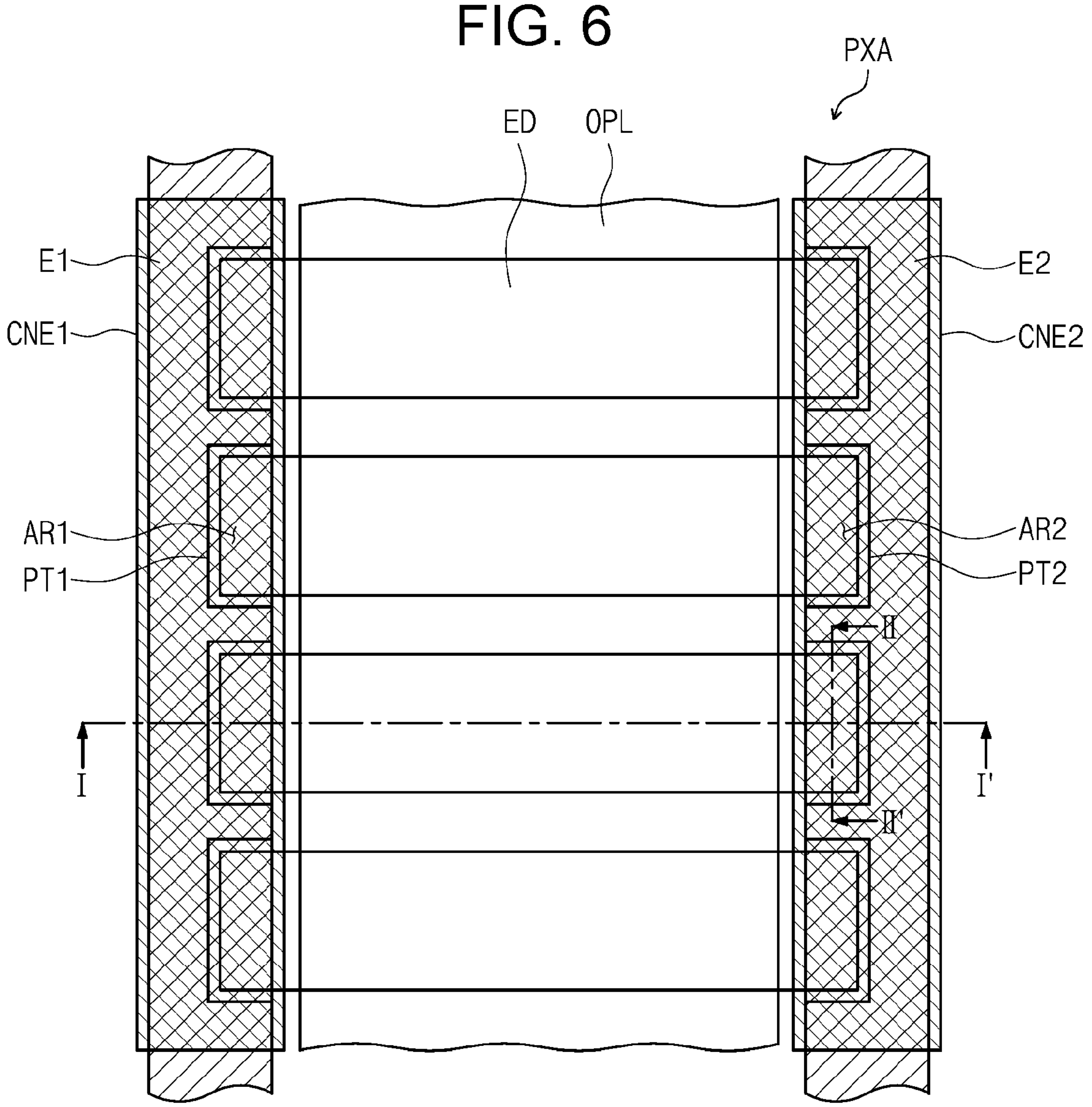
FIG. 6 is a plan view of a pixel according to an embodiment of the present invention.

FIG. 6 is a plan view of a pixel according to an embodiment of the present invention. Specifically, FIG. 6 may be a plan view of a portion corresponding to a pixel emission area PXA.

A first electrode E1 and a second electrode E2 may be disposed to be spaced apart from each other. A portion of a light-emitting element ED may be in contact with the first electrode E1, and another portion of the light-emitting element ED may be in contact with the second electrode E2. In a plan view, an area in which the light-emitting element ED and the first electrode E1 overlap with each other is defined as a first area AR1, and an area in which the light-emitting element ED and the second electrode E2 overlap each other is defined as a second area AR2.

A first pattern portion PT1 may be disposed adjacent to the first area AR1, and a second pattern portion PT2 may be disposed adjacent to the second area AR2. The first pattern portion PT1 may surround at least a portion of the first area AR1, and the second pattern portion PT2 may surround at least a portion of the second area AR2. For example, in a plan view, the first pattern portion PT1 may surround one end portion of the light-emitting element ED, and the second pattern portion PT2 may surround the other end portion of the light-emitting element ED. In an embodiment, the first pattern portion PT1 and the second pattern portion PT2 may include an organic material.

In an embodiment, a plurality of light-emitting elements ED may be provided in one pixel emission area PXA. The plurality of light-emitting elements ED may be connected to each other in parallel. In another embodiment of the present invention, only a single light-emitting element ED may be provided in one pixel emission area PXA.

A first connection electrode CNE1 may cover first end portions of the plurality of light-emitting elements ED in a plan view. A second connection electrode CNE2 may cover second end portions of the plurality of light-emitting elements ED in a plan view. In addition, the first connection electrode CNE1 may be provided to overlap the first electrode E1, and the second connection electrode CNE2 may be provided to overlap the second electrode E2. That is, the first connection electrode CNE1 may electrically connect first end portions of the plurality of light-emitting elements ED and the first electrode E1, and the second connection electrode CNE2 may electrically connect second end portions of the plurality of light-emitting elements ED and the second electrode E2.

A protection portion OPL may be disposed between the first electrode E1 and the second electrode E2. The protection portion OPL may cover the plurality of light-emitting elements ED disposed in the pixel emission area PXA. The protection portion OPL may protect the plurality of light-emitting elements ED, and, in an embodiment, the protection portion OPL may include an organic material.

Figure 7:
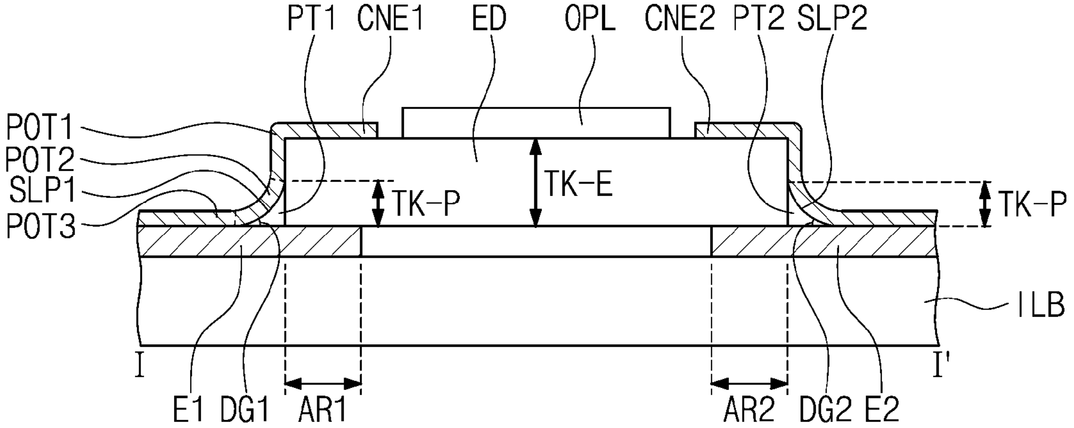
FIG. 7 is an example of a cross-sectional view taken along line I-I' shown in FIG. 6.
Figure 8:
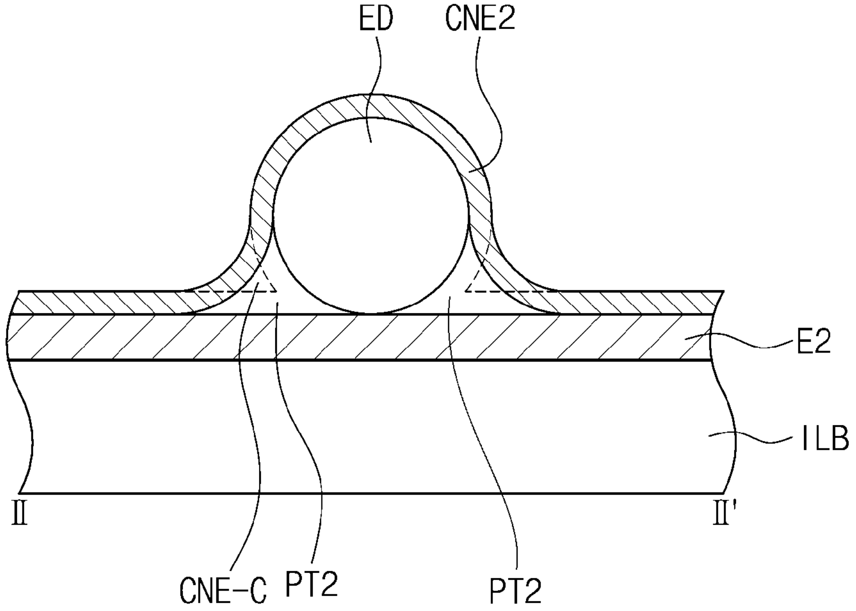
FIG. 8 is an example of a cross-sectional view taken along line II-II' shown in FIG. 6.

FIG. 7 is an example of a cross-sectional view taken along line I-I' shown in FIG. 6; and FIG. 8 is an example of a cross-sectional view taken along line II-II' shown in FIG. 6.

Referring to FIGS. 7 and 8, a first electrode E1 and a second electrode E2 are disposed on a base insulating layer ILB. The base insulating layer ILB may be the base layer BL described with reference to FIG. 4A or the fourth insulating layer L4*a* described with reference to FIG. 4B.

A light-emitting element ED is disposed on the first electrode E1 and the second electrode E2. A first pattern portion PT1 may be disposed on the first electrode E1, and a second pattern portion PT2 may be disposed on the second electrode E2. In an embodiment, the light-emitting element ED may have a cylindrical shape, and, accordingly, the light-emitting element ED may have a circular shape in a cross section shown in FIG. 8.

The first pattern portion PT1 may have a first inclined surface SLP1, and the second pattern portion PT2 may have a second inclined surface SLP2. FIG. 7 shows the first inclined surface SLP1 connecting a point having a maximum height in the first pattern portion PT1 and an end portion of the first pattern portion PT1. The first inclined surface SLP1 may have a plurality of gradients. For example, the first inclined surface SLP1 may have curvature. The end portion of the first pattern portion PT1 may mean an end portion of the first pattern portion PT1 at which the first inclined surface SLP1 and the first electrode E1 are in contact with each other. The second inclined surface SLP2 of the second pattern portion PT2 may also have a plurality of gradients.

A first connection electrode CNE1 may be disposed on the light-emitting element ED, the first electrode E1, and the first pattern portion PT1, and a second connection electrode CNE2 may be disposed on the light-emitting element ED, the second electrode E2, and the second pattern portion PT2.

The first connection electrode CNE1 may be in contact with the first inclined surface SLP1, and the second connection electrode CNE2 may be in contact with the second inclined surface SLP2. In the first connection electrode CNE1, a first portion POT1 covering a portion of an upper surface of the light-emitting element ED and a portion of a side surface of the light-emitting element ED, a second portion POT2 covering the first pattern portion PT1, and a third portion POT3 covering a portion of the first electrode E1 may be defined. The first portion POT1 may be in contact with the light-emitting element ED, the second portion POT2 may be in contact with the first inclined surface SLP1, and the third portion POT3 may be in contact with the first electrode E1.

According to a comparative example in which the first pattern portion PT1 is not provided, a comparative connection electrode CNE-C may be formed along an outer surface of the light-emitting element ED. For convenience of understanding, the comparative connection electrode CNE-C is shown by a dotted line in FIG. 8. A portion between a contact portion of the comparative connection electrode CNE-C and the second electrode E2 and a contact portion of the comparative connection electrode CNE-C and the light-emitting element ED may have a bent shape. In addition, although not shown, in a cross-section of FIG. 7, an angle between a contact portion of the comparative connection electrode CNE-C and the light-emitting element ED and a contact portion of the comparison connection electrode CNE-C and the first electrode E1 may be close to 90°.

When the first pattern portion PT1 and the second pattern portion PT2 are omitted, the comparison connection electrode CNE-C may be disconnected to not connect the first electrode E1 and the light-emitting element ED, or cracks may be generated in the comparison connection electrode CNE-C to increase resistance of the comparative connection electrode CNE-C. When the comparative connection electrode CNE-C is disconnected, the light-emitting element ED may not emit light, and when cracks are generated in the comparative connection electrode CNE-C, luminous efficiency of the light-emitting element ED may be lowered. Further, if the comparative connection electrode CNE-C is formed to be relatively thick to avoid these problems, a process time of an etching process of patterning the comparative connection electrode CNE-C may be increased, and as the process time may be increased, etch skew may occur. When pattern uniformity is lowered due to the etch skew, characteristics of an element may be changed. In particular, in the case of a fine pattern process, a pattern may be disconnected due to the etch skew.

According to an embodiment of the present invention, the first pattern portion PT1 is disposed between the first connection electrode CNE1 and the light-emitting element ED. A change in gradient of the first connection electrode CNE1 may be relatively gradual due to the first pattern portion PT1. Therefore, it is possible to reduce a phenomenon in which the first connection electrode CNE1 is disconnected or cracked due to an abrupt change in gradient. Therefore, the first connection electrode CNE1 may be formed to be thinner than the comparative connection electrode CNE-C. As a result, a process time of an etching process of patterning the first connection electrode CNE1 may also be reduced. As the process time of the etching process is reduced, the probability of etch skew may also be reduced, which may be advantageous in forming a fine pattern. Since the second pattern portion PT2 has substantially the same shape as the first pattern portion PT1, further descriptions of the second pattern portion PT2 are omitted. In the present specification, a change in gradient being gradual means that a difference between a first gradient and a second gradient different from each other is reduced.

In an embodiment, a maximum height TK-P of each of the first pattern portion PT1 and the second pattern portion PT2 may be smaller than a thickness TK-E of the light-emitting element ED. The maximum height TK-P may correspond to a height of a portion at which each of the first pattern portion PT1 and the second pattern portion PT2 is in contact with the light-emitting element ED. For example, the maximum height TK-P of each of the first pattern portion PT1 and the second pattern portion PT2 may be 50% or less of the thickness TK-E of the light-emitting element ED. When a height of each of the first pattern portion PT1 and the second pattern portion PT2 is increased, a contact area of the light-emitting element ED and the first connection electrode CNE1 and a contact area of the light-emitting element ED and the second connection electrode CNE2 may be reduced, which may cause a decrease in luminous efficiency. Accordingly, in an embodiment, the maximum height TK-P may be in a range of 1% to 50% of the thickness TK-E of the light-emitting element ED.

In an embodiment, an angle DG1 between the first inclined surface SLP1 and the first electrode E1 and an angle DG2 between the second inclined surface SLP2 and the second electrode E2 may be 70° or less. As the angles DG1 and DG2 are increased, a gradient between the second portion POT2 and the third portion POT3 of each of the first connection electrode CNE1 and the second connection electrode CNE2 may be abruptly changed. The abrupt change in gradient may cause cracks or disconnection of the first connection electrode CNE1 and the second connection electrode CNE2. In an embodiment, the angles DG1 and DG2 may be in a range of 1° to 70°.

According to one or more embodiments of the present invention, a phenomenon, in which the first and second connection electrodes CNE1 and CNE2 are disconnected or cracked, may be prevented or substantially prevented due to the first and second pattern portions PT1 and PT2. As a result, product manufacturing yield may be improved, and the light-emitting element ED may be stably coupled to the first electrode E1 and the second electrode E2, thereby improving product reliability.

Figure 9:
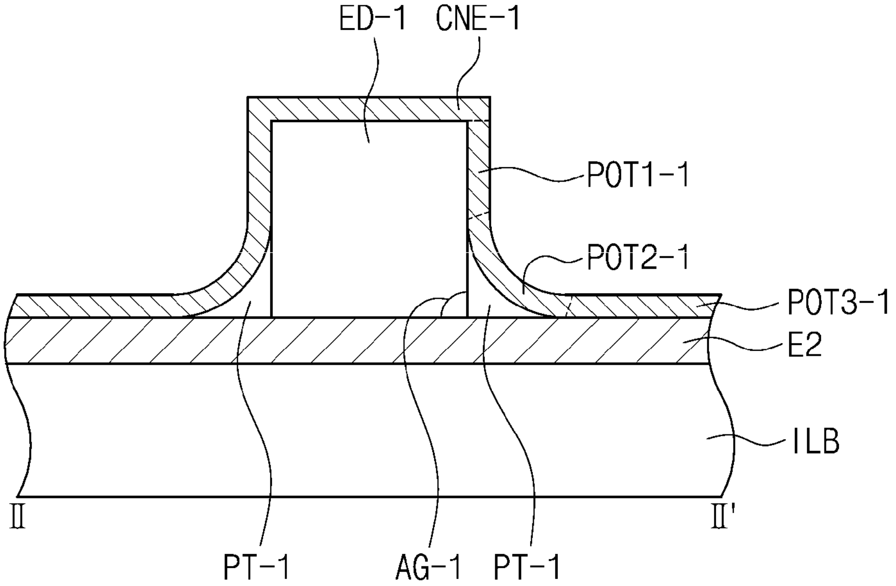
FIG. 9 is another example of a cross-sectional view taken along line II-II' shown in FIG. 6.

FIG. 9 is another example of a cross-sectional view taken along line II-II' of FIG. 6.

Referring to FIG. 9, in an embodiment, a light-emitting element ED-1 may have a polygonal column shape. For example, the light-emitting element ED-1 may have a rectangular column shape. In an embodiment, an angle AG-1 formed between a side of the light-emitting element ED-1 and a second electrode E2 may be 90°.

According to an embodiment of the present invention, a pattern portion PT-1 is provided between the light-emitting element ED-1 and a connection electrode CNE-1. A portion at which a gradient of the connection electrode CNE-1 is abruptly changed may be removed due to the pattern portion PT-1. For example, when the pattern portion PT-1 is omitted, the gradient of the connection electrode CNE-1 may be directly changed from a gradient of a first portion POT1-1 to a gradient of a third portion POT3-1. However, according to an embodiment of the present invention, the gradient of the connection electrode CNE-1 may be changed from the gradient of the first portion POT1-1 to a gradient of a second portion POT2-1 and then may be changed to the gradient of the third portion POT3-1.

Figure 10:
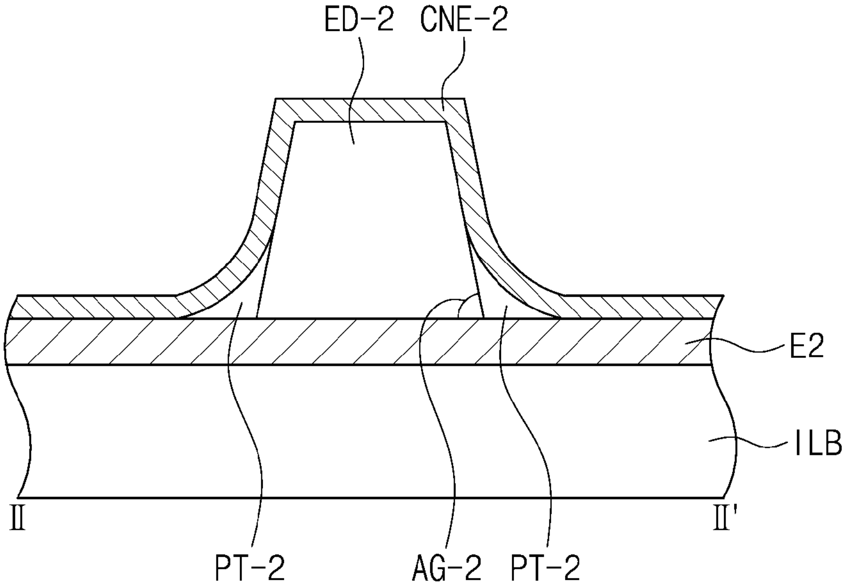
FIG. 10 is another example of a cross-sectional view taken along line II-II' shown in FIG. 6.

FIG. 10 is another example of a cross-sectional view taken along line II-II' shown in FIG. 6.

Referring to FIG. 10, in an embodiment, a light-emitting element ED-2 may have a polygonal column shape. For example, the light-emitting element ED-2 may have a trapezoidal column shape. In an embodiment, an angle AG-2 formed between a side of the light-emitting element ED-2 and a second electrode E2 may be 70°.

In an embodiment of the present invention, when the angle AG-2 is in a range of 60° to 180°, for example, a range of 70° to 180°, a pattern portion PT-2 may be applied. As the angle AG-2 is increased, a gradient of a connection electrode CNE-2 may be abruptly changed. Therefore, a change in gradient of the connection electrode CNE-2 may be gradual by applying the pattern portion PT-2.

FIGS. 11A to 11H are views illustrating some of processes of manufacturing a display device according to an embodiment of the present invention.

Figure 11A:
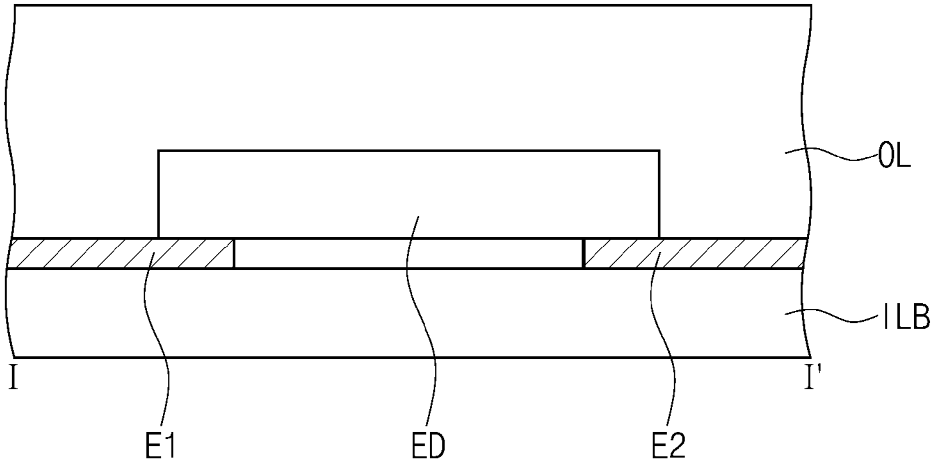
FIGS. 11A to 11H are views illustrating some of processes of manufacturing a display device according to an embodiment of the present invention.

Referring to FIG. 11A, a first electrode E1 and a second electrode E2 are formed on a base insulating layer ILB.

A light-emitting element ED is disposed or transferred onto the first electrode E1 and the second electrode E2. For example, a plurality of light-emitting elements ED may be provided, the plurality of light-emitting elements ED may be concurrently (e.g., simultaneously) transferred, or single light-emitting elements ED may be transferred one by one.

A method of transferring the light-emitting element ED onto the first electrode E1 and the second electrode E2 may include any of a direct transfer method and a printing transfer method, for example. The direct transfer method may be a method of directly transferring the light-emitting element ED to the first electrode E1 and the second electrode E2. In an embodiment, the printing transfer method may be a method of transferring the light-emitting element ED to the first electrode E1 and the second electrode E2 using an electrostatic head, a flat stamp, or a roll stamp. In an embodiment, a solvent, such as an ink or a paste, containing the light-emitting element ED may be supplied onto the first electrode E1 and the second electrode E2 to transfer the light-emitting element ED. The solvent may be a material that may be vaporized at room temperature or by heat. Power is applied to the first electrode E1 and the second electrode E2 to form an electric field between the first electrode E1 and the second electrode E2. Bipolarity may be induced in the light-emitting element ED by the electric field, and the light-emitting element ED may be aligned on the first electrode E1 and the second electrode E2 by a dielectrophoretic force.

An organic layer OL covering the light-emitting element ED, the first electrode E1, and the second electrode E2 is formed. The organic layer OL may be formed through a coating process, but a process of forming the organic layer OL is not limited thereto. In an embodiment, the organic layer OL may be a photoresist layer.

Figure 11B:
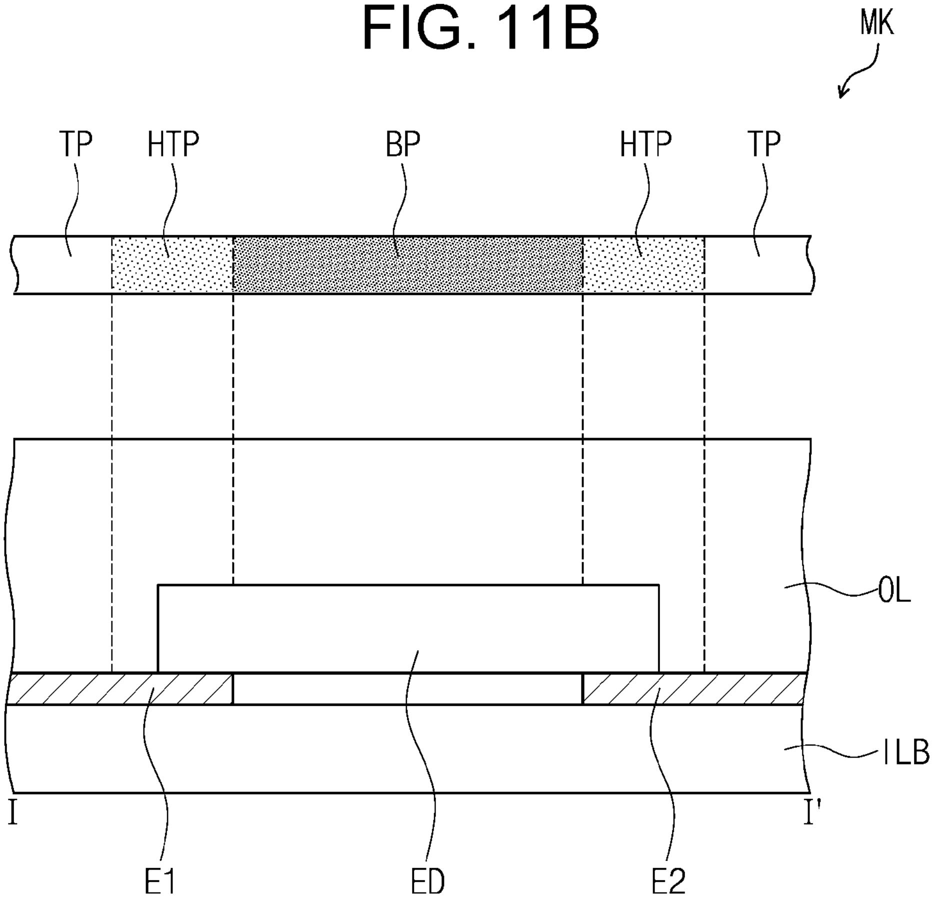

Referring to FIG. 11B, a mask MK is disposed on the organic layer OL. In an embodiment, the mask MK may be a halftone mask including a half-transparent portion HTP, a transparent portion TP, and a light-blocking portion BP.

The organic layer OL may be a positive photoresist layer or a negative photoresist layer. In FIG. 11B, a case in which the organic layer OL is a positive photoresist layer is described as an example.

At least a portion of the half-transparent portion HTP may overlap the first electrode E1 and the second electrode E2 in a plan view. The light-blocking portion BP may be disposed to overlap a portion of the light-emitting element ED which does not overlap the first electrode E1 and the second electrode E2. The transparent portion TP may be disposed in other areas. After the mask MK is disposed on the organic layer OL, light is irradiated.

Figure 11C:
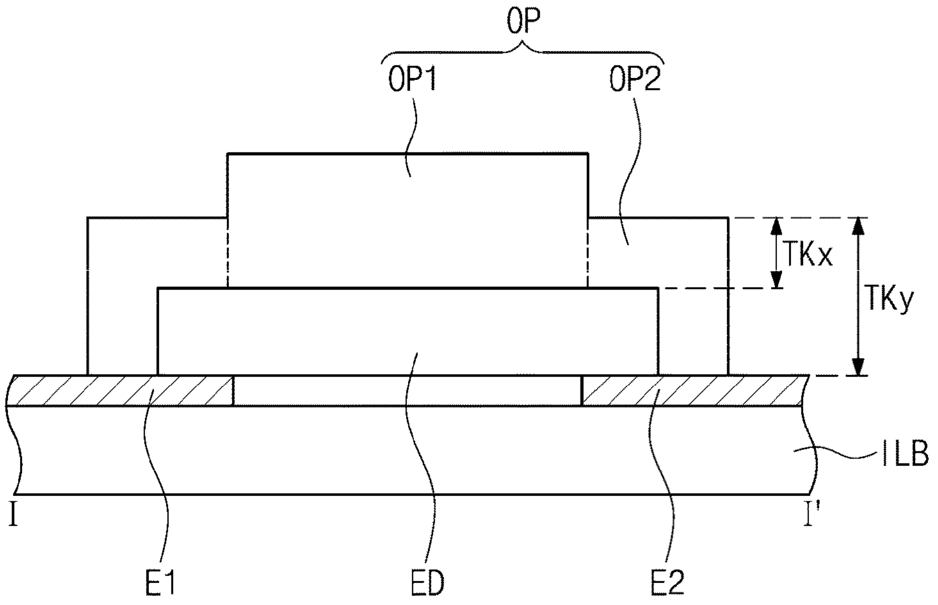

Referring to FIG. 11C, the exposed organic layer OL (see FIG. 11B) is developed to form an organic pattern OP. The organic pattern OP may include a first organic pattern portion OP1 and a second organic pattern portion OP2. The first organic pattern portion OP1 may be a portion which remains due to light being blocked, and the second organic pattern portion OP2 may be a portion in which a portion of the organic layer OL (see FIG. 11B) in a thickness direction thereof is removed due to light being partially irradiated. The organic pattern OP is formed and then is baked.

A thickness TKx of a portion of the second organic pattern portion OP2 which is disposed on the light-emitting element ED may be different from a thickness TKy of a portion of the second organic pattern portion OP2 which is disposed on the first electrode E1 or the second electrode E2. A thickness difference of the second organic pattern portion OP2 may be generated due to a stepped portion formed by the light-emitting element ED.

Figure 11D:
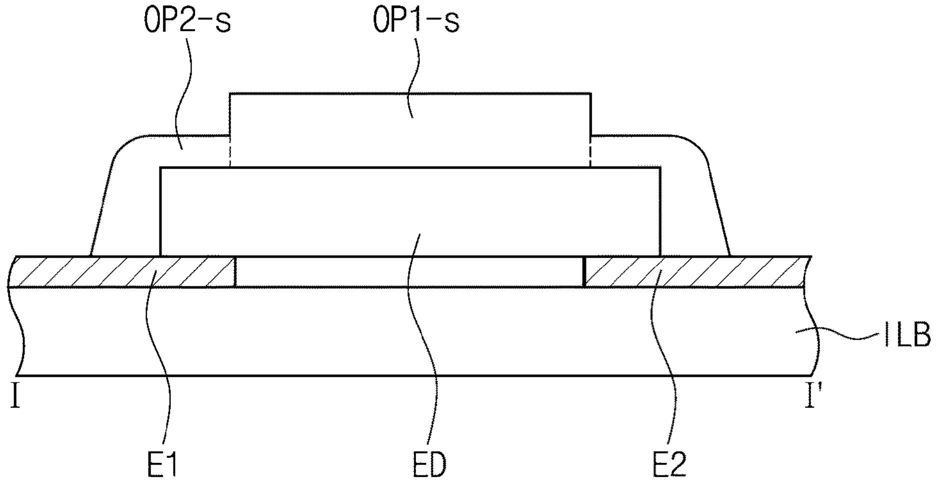
Figure 11E:
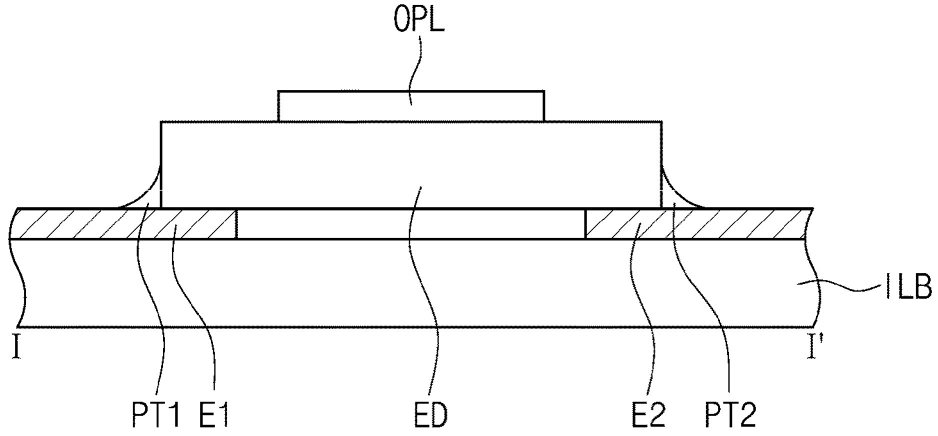

Referring to FIGS. 11D and 11E, an operation of removing a portion of the organic pattern OP is shown. FIG. 11D shows a state in which a portion of the organic pattern OP (see FIG. 11C) is being removed, and FIG. 11E shows a state in which a portion of the organic pattern OP is completely removed.

In an embodiment, a portion of the organic pattern OP may be removed using an ashing process. A thickness of a first organic pattern portion OP1-*s* and a thickness of a second organic pattern portion OP2-*s* may be gradually reduced.

A portion of the second organic pattern portion OP2-*s* may remain without being removed due to a difference in thickness for each area thereof. The remaining portion may constitute a first pattern portion PT1 and a second pattern portion PT2. The thickness of the first organic pattern portion OP1-*s* may be reduced to constitute a protection portion OPL. The first pattern portion PT1, the second pattern portion PT2, and the protection portion OLP may be concurrently (e.g., simultaneously) formed through the same process.

Figure 11F:
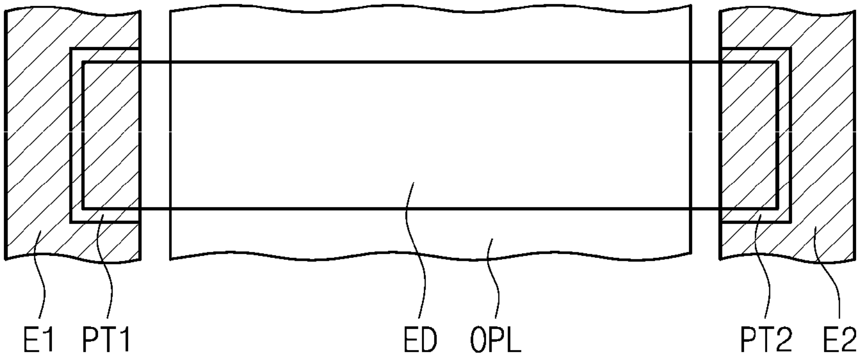

FIG. 11F is a plan view of FIG. 11E. The first pattern portion PT1 may remain by surrounding an end portion of the light-emitting element ED, and the second pattern portion PT2 may remain by surrounding another end portion of the light-emitting element ED.

The protection portion OPL may cover at least a portion of an upper surface of the light-emitting element ED. The protection portion OPL may prevent or substantially prevent an array of the light-emitting elements ED from being distorted, and the protection portion OPL may also protect the light-emitting elements ED during a subsequent process.

Figure 11G:
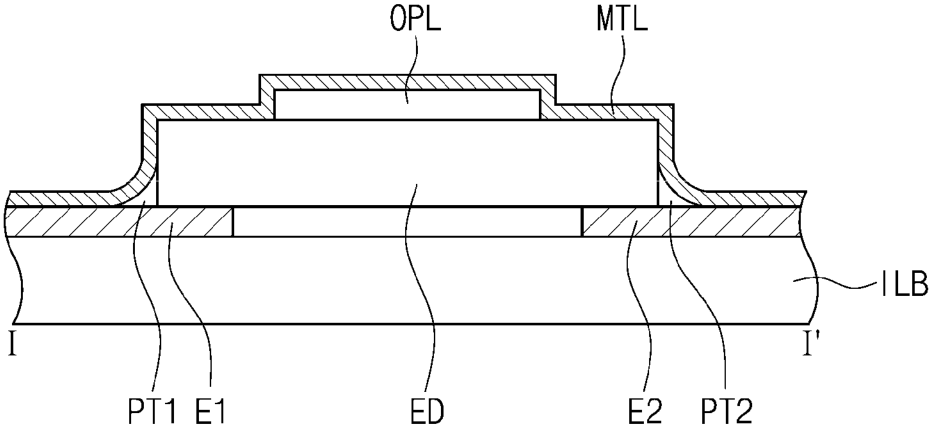

Referring to FIG. 11G, after the protection portion OPL, the first pattern portion PT1, and the second pattern portion PT2 are formed, a conductive layer MTL is formed. The conductive layer MTL may include one selected from indium zinc oxide (IZO), indium tin oxide (ITO), indium gallium oxide (IGO), indium gallium zinc oxide (IGZO), and a mixture/compound thereof. However, the present invention is not limited thereto. For example, the conductive layer MTL may include molybdenum, silver, titanium, copper, aluminum, or an alloy thereof.

Figure 11H:
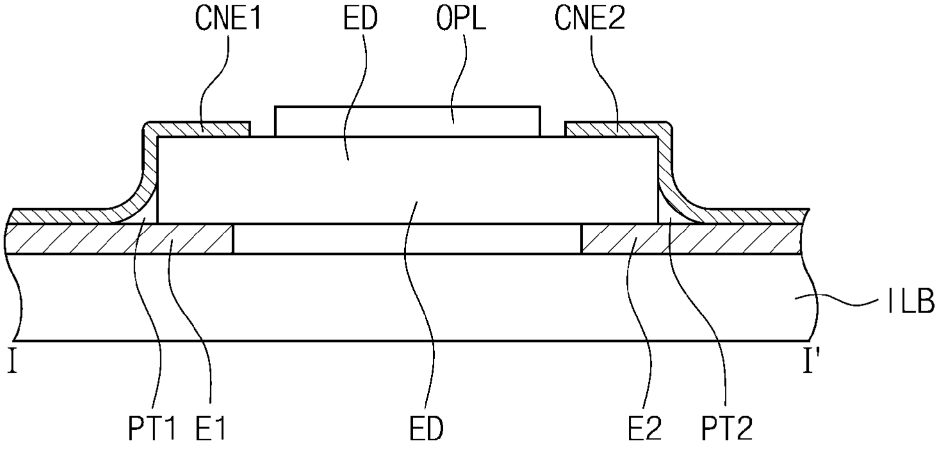

Referring to FIG. 11H, the conductive layer MTL is patterned to form a first connection electrode CNE1 and a second connection electrode CNE2. According to an embodiment of the present invention, changes in gradients of the first connection electrode CNE1 and the second connection electrode CNE2 may be gradual due to the first pattern portion PT1 and the second pattern portion PT2. Therefore, it is possible to reduce a phenomenon in which the first connection electrode CNE1 and the second connection electrode CNE2 are disconnected or cracked. Since the possibility of occurrence of disconnection or cracks is reduced, the thicknesses of the first connection electrode CNE1 and the second connection electrode CNE2 may be reduced. Thus, a process time of an etching process may be reduced, which may be advantageous for a fine pattern manufacturing process.

FIGS. 12A to 12G are views illustrating some of processes of manufacturing a display device according to an embodiment of the present invention. In the following description with reference to FIGS. 12A to 12G, portions different from those in FIGS. 11A to 11H will be described in further detail, and the same reference numerals will be used for the same components, and descriptions of the same components may be omitted.

Figure 12A:
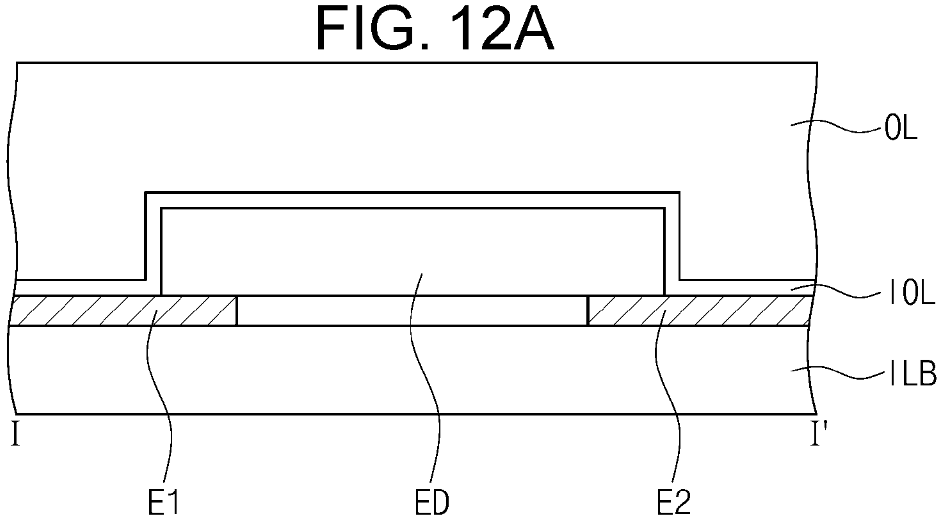
FIGS. 12A to 12G are views illustrating some of processes of manufacturing a display device according to an embodiment of the present invention.

Referring to FIG. 12A, an inorganic layer IOL covering a light-emitting element ED, a first electrode E1, and a second electrode E2 is formed, and after the inorganic layer IOL is formed, an organic layer OL is formed.

Figure 12B:
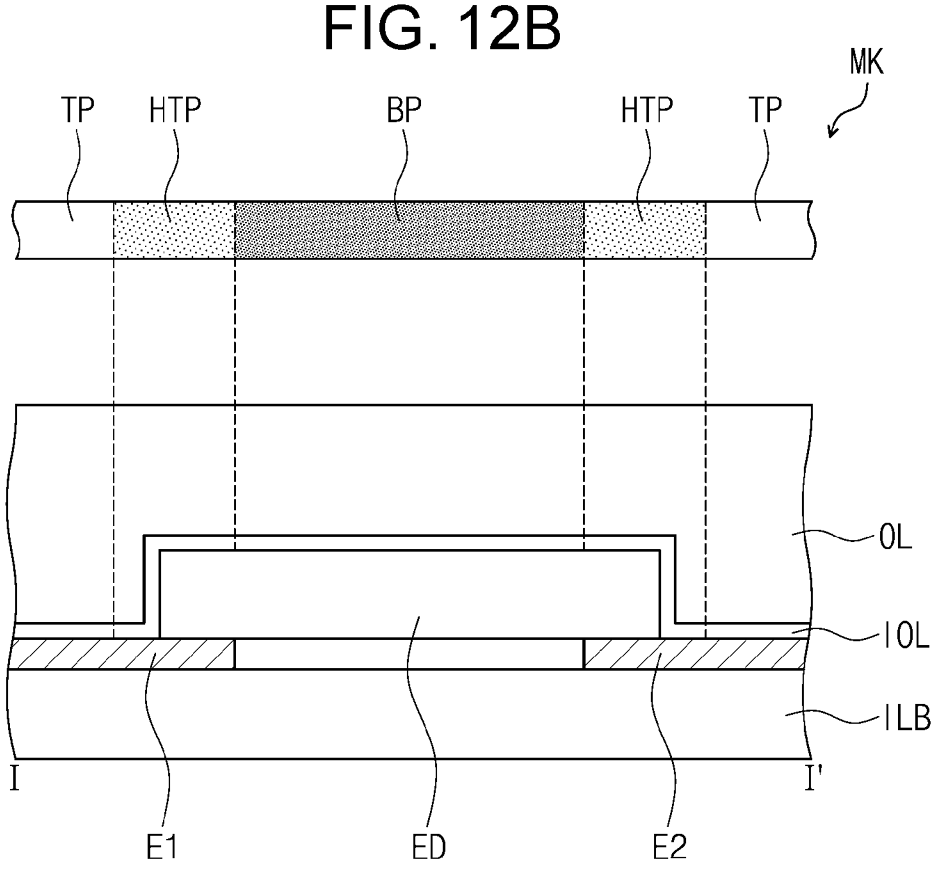

Referring to FIG. 12B, a mask MK is disposed on the organic layer OL, and light is irradiated onto the organic layer OL.

Figure 12C:
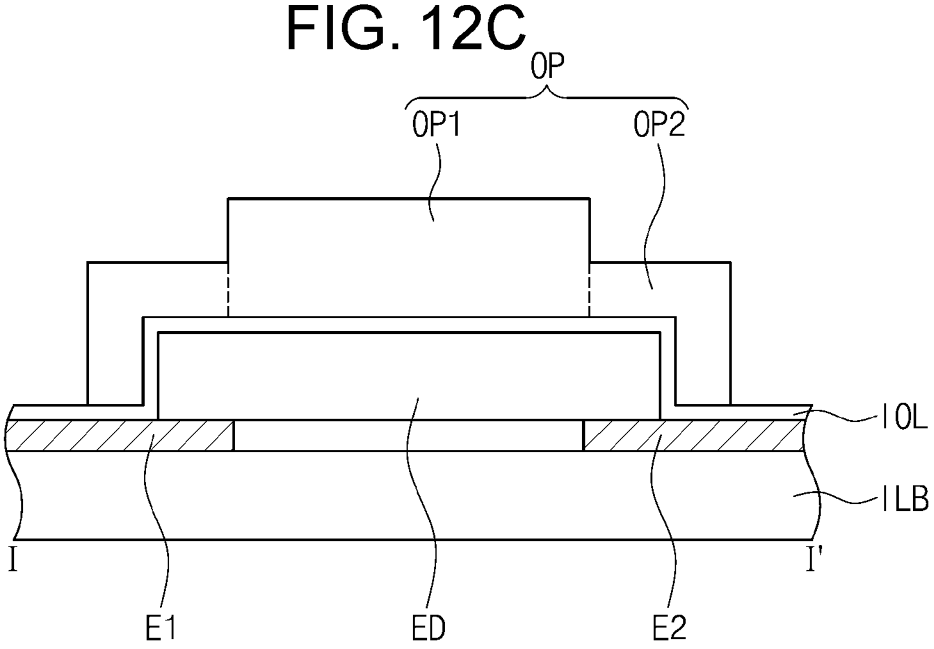

Referring to FIG. 12C, the exposed organic layer OL is developed to form an organic pattern OP. The organic pattern OP may be disposed on the inorganic layer IOL.

Figure 12D:
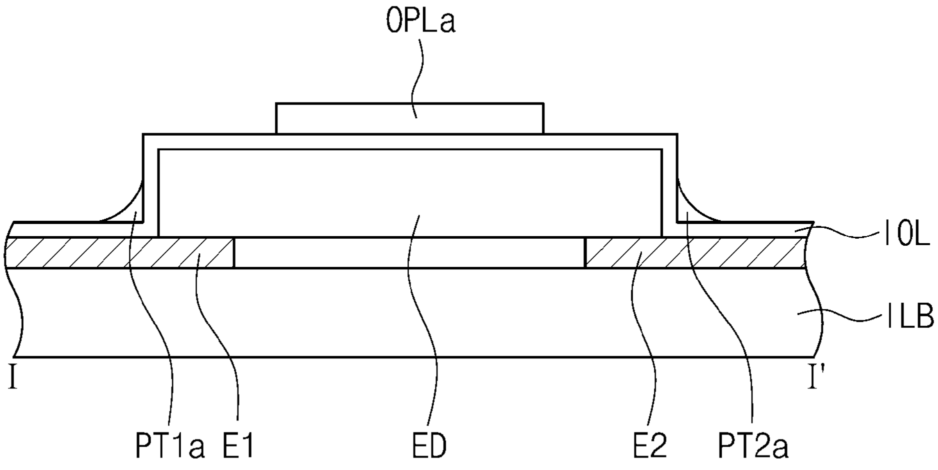

Referring to FIG. 12D, the organic pattern OP is ashed to form an organic protection portion OPLa, a first pattern portion PT1*a*, and a second pattern portion PT2*a*. The organic protection portion OPLa may be referred to as a second protection portion.

Figure 12E:
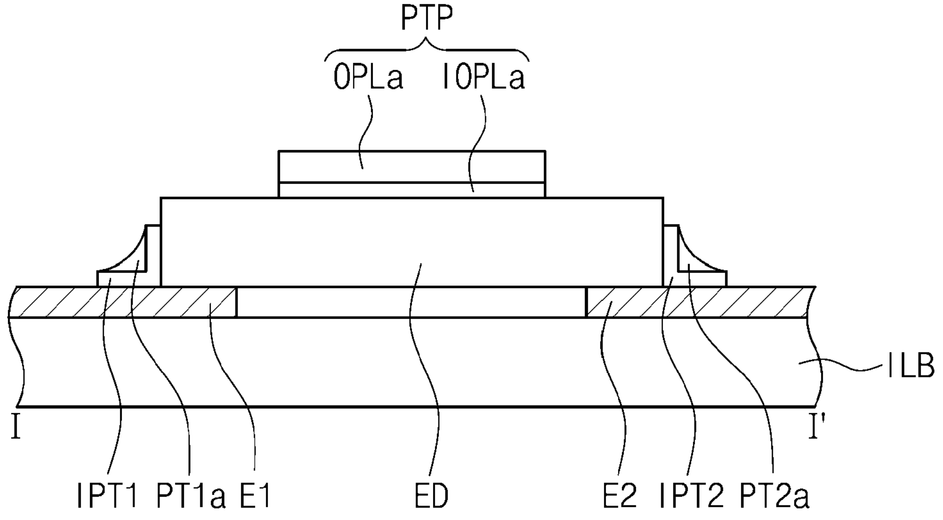

Referring to FIG. 12E, a portion of the inorganic layer IOL (see FIG. 12D) not covered by the organic protection portion OPLa, the first pattern portion PT1*a*, and the second pattern portion PT2*a* is removed. A portion of the inorganic layer IOL may be removed to form a first inorganic pattern portion IPT1, a second inorganic pattern portion IPT2, and an inorganic protection portion IOPLa. That is, the first inorganic pattern portion IPT1, the second inorganic pattern portion IPT2, and the inorganic protection portion IOPLa may be concurrently (e.g., simultaneously) formed through a same process. The inorganic protection portion IOPLa may be referred to as a first protection portion. A protection portion PTP may include the first protection portion IOPLa including an inorganic material and the second protection portion OPLa.

The first inorganic pattern portion IPT1 may be disposed under the first pattern portion PT1*a*, and the second inorganic pattern portion IPT2 may be disposed under the second pattern portion PT2*a*. For example, the first inorganic pattern portion IPT1 may be disposed between the first pattern portion PT1*a* and the light-emitting element ED and between the first pattern portion PT1*a* and the first electrode E1, and the second inorganic pattern portion IPT2 may be disposed between the second pattern portion PT2*a* and the light-emitting element ED and between the second pattern portion PT2*a* and the second electrode E2.

Figure 12F:
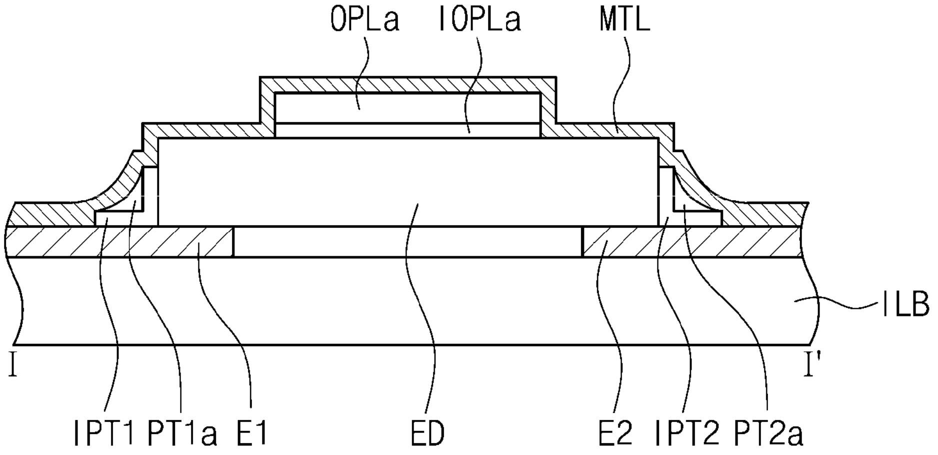
Figure 12G:
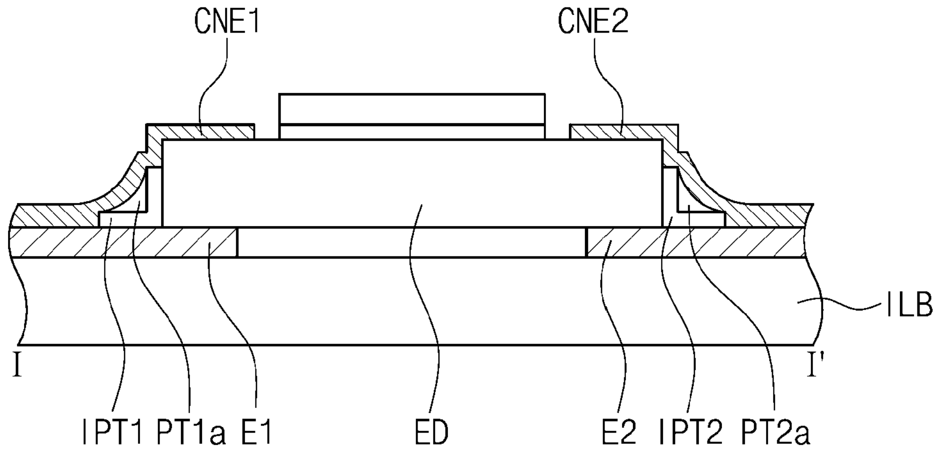

Referring to FIGS. 12F and 12G, a conductive layer MTL is formed. The conductive layer MTL may cover all of the first electrode E1, the second electrode E2, the first pattern portion PT1*a*, the second pattern portion PT2*a*, the first inorganic pattern portion IPT1, the second inorganic pattern portion IPT2, the first protection portion IOPLa, and the second protection portion OPLa.

The conductive layer MTL is patterned to form a first connection electrode CNE1 and a second connection electrode CNE2. The first connection electrode CNE1 may electrically connect the light-emitting element ED and the first electrode E1, and the second connection electrode CNE2 may electrically connect the light-emitting element ED and the second electrode E2.

In FIGS. 12F and 12G, the first connection electrode CNE1 and the second connection electrode CNE2 may be concurrently (e.g., simultaneously) formed, but the present invention is not limited thereto. For example, in another embodiment of the present invention, the conductive layer MTL is patterned to form the first connection electrode CNE1, and an insulating layer (not shown) covering the first connection electrode CNE1 is formed. Thereafter, the conductive layer may be formed on the insulating layer, and the conductive layer may be patterned to form the second connection electrode CNE2. That is, the first connection electrode CNE1 and the second connection electrode CNE2 may not be concurrently (e.g., simultaneously) formed.

According to an embodiment of the present invention, changes in gradients of the first connection electrode CNE1 and the second connection electrode CNE2 may be gradual due to the first pattern portion PT1*a* and the second pattern portion PT2*a*.

Accordingly, it is possible to reduce a phenomenon in which each of the first connection electrode CNE1 and the second connection electrode CNE2 is disconnected or cracked. In addition, since the possibility of occurrence of disconnection or cracks is reduced, the thicknesses of the first connection electrode CNE1 and the second connection electrode CNE2 may be reduced. Thus, a process time of an etching process may be reduced, which may be advantageous for a fine pattern manufacturing process.

Although the present invention has been described with reference to some example embodiments, it is to be understood that the present invention may be variously changed and modified by one of ordinary skill in the art within the spirit and scope of the present invention as herein claimed. Therefore, the technical scope of the present invention is not limited to the example embodiments described herein, but should be determined by the claims.

Typically, due to cracks generated in a connection electrode connecting a light-emitting element and an electrode, resistance between the light-emitting element and the electrode may be increased, which may cause a decrease in luminous efficiency. According to one or more embodiments of the present invention, a display device having improved connection stability between a light-emitting element and an electrode, and a method for manufacturing the display device, are provided. Therefore, the display device and embodiments of the present invention relating to the display device and a manufacturing method thereof have high industrial applicability.

The invention claimed is:

1. A display device comprising:

a first electrode;

a second electrode spaced apart from the first electrode;

a light-emitting element on and directly contacting the first electrode and the second electrode;

a first pattern portion adjacent to a first area in which the first electrode and the light-emitting element overlap each other in a plan view along a first direction;

a second pattern portion adjacent to a second area in which the second electrode and the light-emitting element overlap each other in a plan view along the first direction;

a first connection electrode covering the light-emitting element and the first pattern portion and being electrically connected between the light-emitting element and the first electrode, the first pattern portion being between the first connection electrode and the first electrode along the first direction; and a second connection electrode covering the light-emitting element and the second pattern portion and being electrically connected between the light-emitting element and the second electrode, the second pattern portion being between the second connection electrode and the second electrode along the first direction, wherein the first pattern portion and the second pattern portion do not overlap the light-emitting element in a plan view along the first direction, and wherein a first end surface of the light-emitting element is spaced apart from a second end surface of the light-emitting element along a longitudinal direction of the light-emitting element, the longitudinal direction intersecting the first direction, the first connection electrode physically contacts a portion of the first end surface facing in the longitudinal direction, and the second connection electrode physically contacts a portion of the second end surface facing in a direction opposite the longitudinal direction.

2. The display device of claim 1, wherein each of the first pattern portion and the second pattern portion includes an organic material.

3. The display device of claim 1, wherein the display device comprises a plurality of light-emitting elements including the light-emitting element and being connected in parallel.

4. The display device of claim 1, wherein a first thickness of the light-emitting element is greater than a first maximum height of the first pattern portion and a second maximum height of the second pattern portion.

5. The display device of claim 4, wherein each of the first maximum height and the second maximum height is 50% or less of the first thickness.

6. The display device of claim 1, wherein an inclination angle between the first electrode and the light-emitting element is 60° or more.

7. The display device of claim 1, wherein the first connection electrode comprises a first portion disposed on the light-emitting element, a second portion disposed on the first pattern portion, and a third portion disposed on the first electrode, and an angle between an inclined surface of the first pattern portion in contact with the second portion and the first electrode disposed under the first pattern portion is 70° or less.

8. The display device of claim 1, further comprising a protection portion disposed on the light-emitting element, wherein the protection portion is disposed between the first pattern portion and the second pattern portion in a plan view.

9. The display device of claim 8, wherein the protection portion includes a first protection portion including an inorganic material and a second protection portion including an organic material, and the first protection portion is disposed between the second protection portion and the light-emitting element.

10. The display device of claim 1, further comprising:

a first inorganic pattern portion disposed between the first pattern portion and the light-emitting element and between the first pattern portion and the first electrode; and a second inorganic pattern portion disposed between the second pattern portion and the light-emitting element and between the second pattern portion and the second electrode.

11. The display device of claim 1, wherein the light-emitting element has a cylindrical shape or a polygonal column shape.

12. A display device comprising:

a first electrode;

a second electrode spaced apart from the first electrode;

a light-emitting element on and directly contacting the first electrode and the second electrode;

a first connection electrode on the first electrode and the light-emitting element and electrically connected between the first electrode and the light-emitting element;

a second connection electrode on the second electrode and the light-emitting element and electrically connected between the second electrode and the light-emitting element;

a first pattern portion which is between the first connection electrode and the light-emitting element and between the first connection electrode and the first electrode, and comprises a first inclined surface in contact with the first connection electrode; and a second pattern portion which is between the second connection electrode and the light-emitting element and between the second connection electrode and the second electrode, and comprises a second inclined surface in contact with the second connection electrode, wherein the first pattern portion and the second pattern portion do not overlap the light-emitting element in a plan view along a first direction, and wherein a first end surface of the light-emitting element is spaced apart from a second end surface of the light-emitting element along a longitudinal direction of the light-emitting element, the longitudinal direction intersecting the first direction, the first connection electrode physically contacts a portion of the first end surface facing in the longitudinal direction, and the second connection electrode physically contacts a portion of the second end surface facing in a direction opposite the longitudinal direction.

13. The display device of claim 12, wherein each of the first pattern portion and the second pattern portion includes an organic material.

14. The display device of claim 12, wherein the first pattern portion surrounds at least a portion of an area in which the light-emitting element and the first electrode overlap each other in a plan view, and the second pattern portion surrounds at least a portion of an area in which the light-emitting element and the second electrode overlap each other in a plan view.

15. The display device of claim 12, wherein each of an angle between the first inclined surface and the first electrode and an angle between the second inclined surface and the second electrode is 70° or less.

16. A method for manufacturing a display device, the method comprising:

forming a first electrode and a second electrode on an insulating layer;

arranging a light-emitting element on the first electrode and the second electrode;

forming an organic layer covering the light-emitting element, the first electrode, and the second electrode;

arranging a mask on the organic layer;

forming an organic pattern by exposing and developing the organic layer using the mask;

removing a portion of the organic pattern to form a first pattern portion disposed adjacent to a first area in which the first electrode and the light-emitting element overlap each other in a plan view and form a second pattern portion disposed adjacent to a second area in which the second electrode and the light-emitting element overlap each other in a plan view; and forming a first connection electrode electrically connected to the light-emitting element and the first electrode on the first pattern portion and a second connection electrode electrically connected to the light-emitting element and the second electrode on the second pattern portion.

17. The method of claim 16, wherein the mask is a halftone mask including a half-transparent portion, and
the mask is disposed such that the half-transparent portion is disposed in an area overlapping the first electrode and the second electrode in a plan view.

18. The method of claim 16, further comprising removing a portion of the organic pattern to form a protection portion disposed on the light-emitting element,
wherein the protection portion is formed concurrently with the first pattern portion and the second pattern portion.

19. The method of claim 16, further comprising:
prior to the forming of the organic layer, forming an inorganic layer covering the light-emitting element, the first electrode, and the second electrode; and
after the forming of the first pattern portion and the second pattern portion, removing a portion of the inorganic layer that is exposed to form a first inorganic pattern portion disposed under the first pattern portion and form a second inorganic pattern portion disposed under the second pattern portion.

20. The method of claim 19, further comprising:
removing a portion of the organic pattern to form an organic protection portion disposed on the light-emitting element; and
removing a portion of the inorganic layer to form an inorganic protection portion disposed between the light-emitting element and the organic protection portion,
wherein the organic protection portion is formed concurrently with the first pattern portion and the second pattern portion, and
the inorganic protection portion is formed concurrently with the first inorganic pattern portion and the second inorganic pattern portion.

* * * * *